(12) United States Patent
Dairiki

(10) Patent No.: US 6,599,818 B2
(45) Date of Patent: Jul. 29, 2003

(54) SEMICONDUCTOR DEVICE MANUFACTURING METHOD, HEAT TREATMENT APPARATUS, AND HEAT TREATMENT METHOD

(75) Inventor: Koji Dairiki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/970,908

(22) Filed: Oct. 5, 2001

(65) Prior Publication Data

US 2002/0061661 A1 May 23, 2002

(30) Foreign Application Priority Data

Oct. 10, 2000 (JP) ........................................ 2000-309887

(51) Int. Cl.[7] .............................................. H01L 21/20
(52) U.S. Cl. ....................... 438/486; 438/149; 438/151; 438/152; 438/166; 438/473
(58) Field of Search ................................ 438/151, 162, 438/166, 795, 486, 149, 153, 154, 471, 473; 257/59, 410, 411, 347, 72, 344, 345

(56) References Cited

U.S. PATENT DOCUMENTS

| | | | | |
|---|---|---|---|---|
| 5,508,532 A | * | 4/1996 | Teramoto | 257/347 |
| 5,530,265 A | | 6/1996 | Takemura | |
| 5,648,277 A | * | 7/1997 | Zhang et al. | 438/151 |
| 5,712,495 A | * | 1/1998 | Suzawa | 257/350 |
| 5,719,065 A | * | 2/1998 | Takemura et al. | 438/162 |
| 5,739,549 A | * | 4/1998 | Takemura et al. | 257/347 |
| 5,945,711 A | * | 8/1999 | Takemura et al. | 257/344 |
| 5,956,579 A | | 9/1999 | Yamazaki et al. | |
| 6,087,245 A | | 7/2000 | Yamazaki et al. | |
| 6,156,628 A | | 12/2000 | Ohnuma et al. | |

FOREIGN PATENT DOCUMENTS

JP 07-183540 7/1995

OTHER PUBLICATIONS

Tsutsui et al., "Electroluminescence in Organic Thin Films", Photochemical Processes in Organized Molecular Systems, 1991, pp. 437–450.

(List continued on next page.)

*Primary Examiner*—Michael S. Lebentritt
(74) *Attorney, Agent, or Firm*—Eric J. Robinson; Robinson Intellectual Property Law Office, P.C.

(57) ABSTRACT

For manufacture of a semiconductor device using a low heat resistant substrate such as a glass substrate, a method of heat treatment for activating an impurity element that is used to dope a semiconductor film and for performing gettering on the semiconductor film in a short period of time without deforming the substrate, is provided. Also provided is a heat treatment apparatus for carrying out the above heat treatment. The heat treatment method of the present invention involves irradiating an object with light emitted from a lamp light source, and is characterized in that the lamp light source emits light for 0.1 to 20 seconds at a time and that light from the lamp light source irradiates the object several times. The method is also characterized in that the irradiated region is subjected to pulsating light from the lamp light source such that the irradiated region holds the temperature to its highest for 0.5 to 5 seconds. The method is also characterized in that the amount of coolant to be supplied is increased or reduced in accordance with blinking of the lamp light source to enhance the effect of the heat treatment on the semiconductor film and to prevent a heat-induced damage to the substrate.

11 Claims, 21 Drawing Sheets

OTHER PUBLICATIONS

M.A. Baldo et al., "Highly Efficient Phosphorescent Emission from Organic Electroluminescent Devices", Nature vol. 395, Sep. 10, 1998, pp. 151–154.

M.A. Baldo et al., "Very High–Efficiency Green Organic Light–Emitting Devices Based on Electrophosphorescence", Applied Physics Letters vol. 75, No. 1, Jul. 5, 1999, pp. 4–6.

Tsutsui et al., "High Quantum Efficiency in Organic Light–Emitting Devices with Iridium–Comolex as a Triplet Emissive Center", Japanese Journal of Applied Physics vol. 38, Part 12B, Dec. 15, 1999, pp. L1502–L1504.

U.S. patent application Ser. No. 10/001,197, including specification and drawings, "Heat Treatment Apparatus and Method of Manufacturing a Semiconductor Device".

* cited by examiner

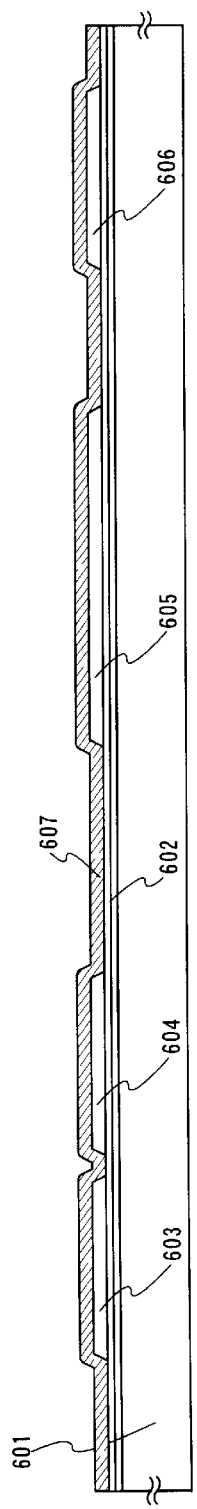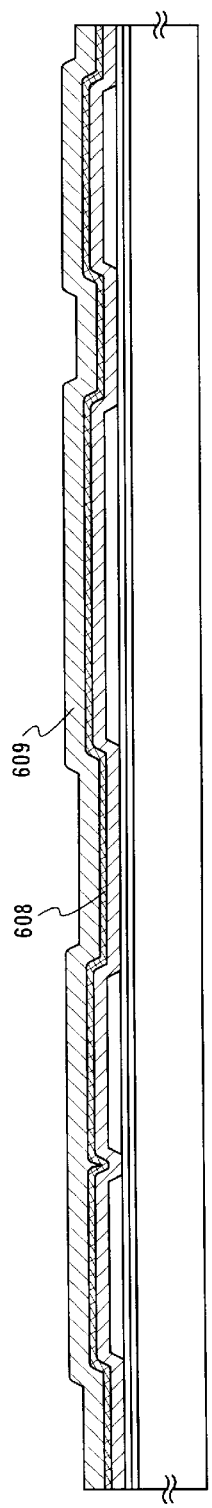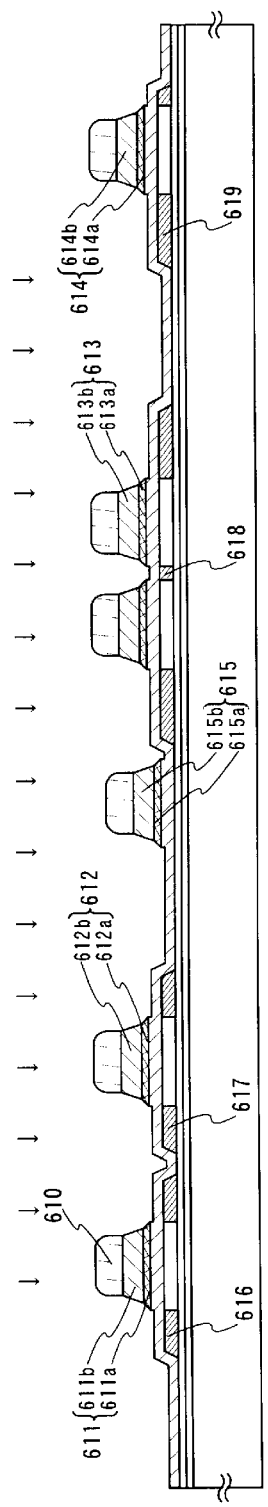

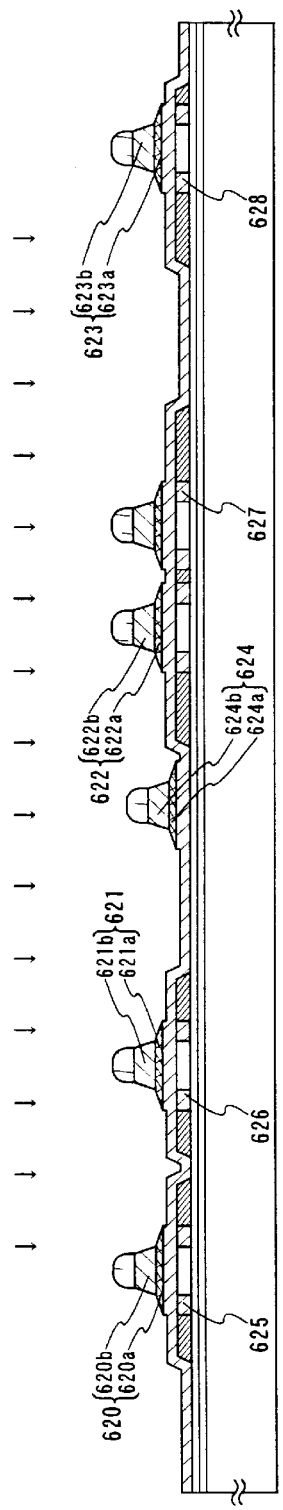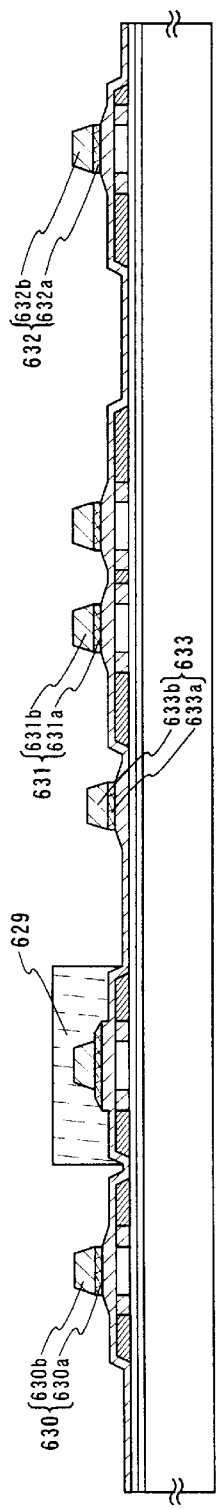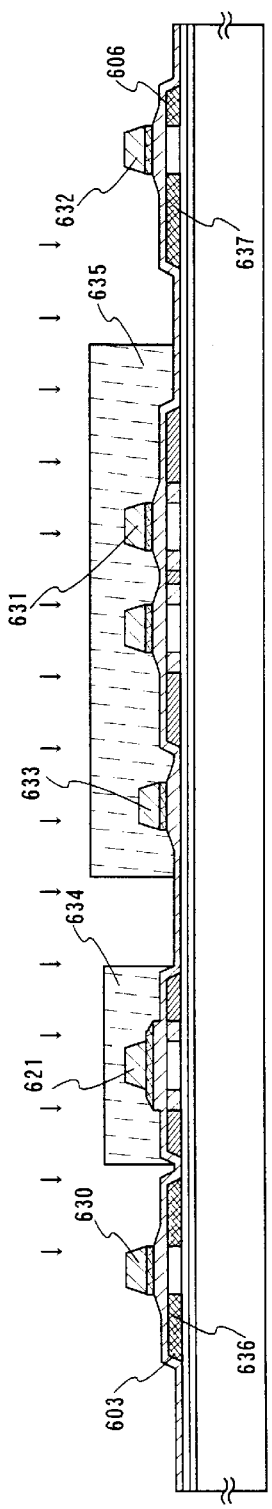

SEMICONDUCTOR DEVICE MANUFACTURING METHOD, HEAT TREATMENT APPARATUS, AND HEAT TREATMENT METHOD

BACKGROUND OF THE INVENTION

1. Field of the Invention

The present invention relates to a semiconductor device manufacturing method, a heat treatment apparatus, and a heat treatment method using the apparatus. Specifically, the invention relates to a heat treatment method and a heat treatment apparatus for crystallizing an amorphous semiconductor film, for recrystallizing and activating a semiconductor film that has been brought back to an amorphous state by ion implantation or ion doping, and for gettering of a metal element remaining in the semiconductor film. The invention also relates to a semiconductor device manufacturing method using this heat treatment method.

2. Description of the Related Art

Having silicon as its main ingredient, a crystalline semiconductor film formed at a process temperature of 600° C. or lower is often called low temperature polysilicon. The primal use of this crystalline semiconductor film is of as an active layer for forming a channel formation region, a source or drain region and the like in a thin film transistor (hereinafter referred to as TFT). The TFT is formed on a glass substrate to manufacture a liquid crystal display device, and technologies related thereto are receiving attention most.

Technologies for manufacturing a TFT using the above crystalline semiconductor film characteristically employ laser annealing and ion doping, and these techniques make it possible to form an n-channel TFT and a p-channel TFT on a large area glass substrate to build an integrated circuit having the CMOS structure.

A TFT needs, in addition to an impurity region of n type or p type conductivity to serve as a source and drain region, a low concentration impurity region that serves as LDD (lightly doped drain) useful in reducing leak current and in stabling TFT characteristics. The TFT also needs to be doped with an impurity element of one conductivity type in order to control the threshold voltage. Formation of the low concentration impurity region and the doping with an impurity element of one conductivity type are conducted through ion doping and subsequent activation treatment. In this ion doping, all of ion species generated are implanted by acceleration implantation without being subjected to mass separation.

The impurity is activated after doping by furnace annealing, laser annealing, or RTA (rapid thermal annealing). The source and drain region, which is relatively heavily doped (concentration: $10^{15}$ atoms/cm$^2$), is said to need a rather high temperature and take a longer time to activate the impurity element used in doping for enhancement of conductance. Laser annealing melts a semiconductor film and is unsatisfactory in controllability and reproducibility, which makes it difficult to employ laser annealing in a mass production process. On the other hand, furnace annealing is suitable for a mass production process since it treats in batches but its activation efficiency decreases as the process temperature becomes low to prolong the treatment time, which is a problem.

Laser annealing as a crystallization technique is capable of forming a crystalline semiconductor film on a glass substrate. However, the reaction is of nonequilibrium one and the crystals formed therefore have small grain size and many defects. Laser annealing crystallization has little direct control factors other than the energy density and irradiation number of laser light and the substrate heating temperature. Furthermore, the direct control factors are effective only for limited ranges. For example, control by energy density is effective when it is 250 to 400 mJ/cm$^2$ and it only gives an amorphous structure outside the range.

A crystallization technique involving adding with a metal element is disclosed in Japanese Patent Application Laid-open No. Hei 7-183540 as a method that can provide better crystals than those obtained by laser annealing. The metal element used is nickel, palladium, lead, or the like. Various methods can be employed in the doping, such as plasma treatment, evaporation, ion implantation, solution application, and sputtering. Crystallization is made by heat treatment at 500 to 600° C., preferably 550° C. for four hours. However, this method leaves the metal element in the semiconductor film crystallized and often needs gettering. Most of the remaining metal element forms a deep level in the forbidden band of the semiconductor film to act as a lifetime killer and to cause an increase of leak current in the junction.

Gettering using phosphorus can make the metal element segregate in a region doped with phosphorus. This gettering uses an annealing furnace and requires heat treatment typically at 450 to 600° C. for twelve hours. The metal element thus segregates in the phosphorus-doped region.

One of the most promising application fields for the thus manufactured TFT is liquid crystal displays and other flat panel displays. In the flat panel display field, increasing the substrate size is demanded for improvement of productivity. These larger substrates come in various sizes and 960×1100 mm$^2$ is among them. A substrate measuring 1000 mm or more in one side is more often considered than others. Liquid crystal display devices are not the only ones who face this demand but it is a common object to all large-area integrated circuits constructed from TFTs formed on glass substrates.

In order to improve the productivity, it is necessary to reduce the number of steps in a TFT manufacturing process and shorten the treatment time. Then, a furnace annealing apparatus, which treats in batches, would not be helpful in improving the production efficiency. If the furnace annealing apparatus is enlarged, current consumption is increased for heating the large capacity furnace, not to mention it needs larger installment area.

RTA is suitable in terms of productivity. RTA is capable of heating and raising the temperature high in a short period of time and latently has higher processing ability than furnace annealing also when the single wafer method is employed. However, short heating time means high heating temperature while a temperature exceeding the distortion point of glass, or even its softening point, is required in order to obtain desired effects in activation and gettering. For instance, a glass substrate is bent and deformed by its own weight by merely sixty seconds of heat treatment at 800° C. for the purpose of gettering.

SUMMARY OF THE INVENTION

The present invention has been made to solve the problems above, and an object of the present invention is therefore to provide, for manufacture of a semiconductor device using a low heat resistant substrate such as a glass substrate, a method of heat treatment for activating an impurity element that is used to dope a semiconductor film and for performing gettering on the semiconductor film in a short period of time without deforming the substrate. Another object of the present invention is to provide a heat treatment apparatus for carrying out the above heat treatment, and a method of manufacturing a semiconductor device using the heat treatment apparatus.

In order to attain the above objects, the present invention provides a method of heat treatment for performing gettering and activation on a semiconductor film formed on a low heat resistant substrate such as a glass substrate in a short period of time without causing deformation or other heat-induced damage to the substrate, as well as a heat treatment apparatus for carrying out the method.

A semiconductor film is formed on a substrate and then doped with phosphorus by ion doping using phosphine without mass separation. Phosphorus getters a metal element in the semiconductor film through a mechanism inferred as follows. When the semiconductor film is selectively doped with phosphorus, a region of the semiconductor film that is doped with phosphorus (gettering region) becomes amorphous. The semiconductor film is then heated so that the amorphous gettering region is crystallized. At this point, phosphorus in the gettering region is moved into a lattice cell of the semiconductor film. The heat treatment cuts the bond of a compound formed from the metal element (referred to as metal compound) in a region that is not doped with phosphorus (to-be-gettered region) (severing of the bond will be called release). Then, the metal element moves (diffusion) to couple with phosphorus (trapping). The metal element is removed from or reduced in the to-be-gettered region supposedly in this way.

Gettering is done through three stages: one, release of the metal element from the metal compound in the to-be-gettered region, two, diffusion of the metal element, and three, trapping of the metal element by phosphorus in the gettering region. The energy required for release of the metal element is estimated as several hundreds degree (° C.) and it is known that the metal element is readily released through heat treatment around 500° C. When the heat treatment is conducted at higher temperature, the rate the metal element diffuses is raised but effective gettering of the metal element cannot be expected. This is probably because phosphorus is stuck in a lattice cell and prevented from coupling with the metal element when the temperature is high.

Accordingly, for effective gettering, the heat treatment has to be made at low temperature while accelerating diffusion of the metal element. The invention achieves this by heating the to-be-gettered region at a temperature higher than the temperature at which the gettering region is heated through pulsative radiation from a lamp light source. Structures of the gettering region and the to-be-gettered region are accordingly modified and a light absorbing film is formed on the gettering region. A gate electrode may serve as the light absorbing film. In this case, a part of the gate electrode is formed from, for example, a tantalum nitride film so that the tantalum nitride film is heated through the radiation from the lamp light source.

The metal element is readily released from the metal compound and diffuses into the gettering region by heating the to-be-gettered region at relatively high temperature. Then, the metal element reaches the gettering region doped with phosphorus and segregates there. High gettering effect is obtained if the heating is stopped before phosphorus is taken to a lattice cell of the silicon network and forms tetradentate bond, in other words, before activation proceeds too far.

The treatment object, namely, the semiconductor film, is heated by irradiating it several times using pulsative radiation from the lamp light source. This makes it possible to rapidly heat and rapidly cool the to-be-gettered region before heat is transmitted to the glass substrate and the gettering region. The light source could be a laser, of course, but a halogen lamp or the like is preferable considering a suitable irradiation time for activation and gettering since irradiating a large area is easy with a lamp light source. The present invention is characterized by conducting gettering and activation in this way.

As described above, the heat treatment method of the present invention involves heating a treatment object by irradiating it several times through pulsative radiation from a lamp light source, and is characterized in that radiation from the lamp light source lasts 0.1 to 20 seconds at a time and that radiation from the lamp light source is repeated several times. The method is also characterized in that the treatment object is subjected to pulsative radiation from the lamp light source such that the treatment object holds the temperature to its highest for 0.5 to 5 seconds. The method is also characterized in that the amount of coolant to be supplied is increased or reduced in accordance with blinking of the lamp light source to enhance the effect of the heat treatment on a semiconductor film that is the treatment object and to prevent a heat-induced damage to a substrate.

A heat treatment apparatus of the present invention is for carrying out the above heat treatment method and is characterized by comprising: a lamp light source; a power source for making the lamp light source blink and pulsate; a stage on which a substrate is placed; a processing chamber in which a treatment object is subjected to radiation from the lamp light source; and means for supplying a coolant to the processing chamber and increasing and reducing the amount of supply.

The lamp light source may be a halogen lamp, a metal halide lamp, a xenon lamp, a high pressure mercury lamp, a high pressure sodium lamp, or an excimer lamp.

The heat treatment apparatus of the present invention may take another structure, which is characterized by comprising: a lamp light source; a power source for making the lamp light source blink and pulsate; a stage on which a substrate is placed; a processing chamber in which a treatment object is subjected to radiation from the lamp light source; transferring means for moving the stage in one direction in the processing chamber; and means for supplying a coolant to the processing chamber and increasing and reducing the amount of supply in accordance with blinking of the lamp light source.

A semiconductor device manufacturing method of the present invention employs the above heat treatment method, and is characterized by comprising the steps of: forming a semiconductor film on a light transmissive substrate; forming an insulating film on the semiconductor film; forming a light absorptive first conductive film on the insulating film; forming a light reflective second conductive film on the first conductive film; doping the semiconductor film with an impurity of one conductivity type to form a semiconductor region of one conductivity type; and activating the semiconductor region of one conductivity type by irradiating the region several times from the light transmissive substrate side through pulsative radiation from a lamp light source.

The semiconductor device manufacturing method of the present invention may take another structure, which is characterized by comprising: a first step of forming an amorphous semiconductor film on one major surface of a light transmissive substrate; a second step of doping the amorphous semiconductor film with a metal element and then crystallizing the amorphous semiconductor film to form a crystalline semiconductor film; a third step of forming, above the crystalline semiconductor film, a conductive film so as to partially overlap the crystalline semiconductor film; a fourth step of forming a semiconductor region doped with phosphorus in the crystalline semiconductor film; and a fifth step of performing intermittent radiation from a lamp light source several times from a surface opposite to the one major surface of the light transmissive substrate.

The treatment object is kept in the coolant and is irradiated several times by radiation from the lamp light source such that the treatment object holds the temperature to its highest, 600 to 800° C., for 30 to 600 seconds. In this way., the treatment object can be heated efficiently, completing the heat treatment. The wavelength of the electromagnetic wave radiated from the lamp light source is matched to the absorption band of the treatment object for selective heating so that the treatment object alone is heated. Specifically, a semiconductor film formed on a glass substrate having a distortion point of 700° C. or lower is heated.

BRIEF DESCRIPTION OF THE DRAWINGS

In the accompanying drawings:

FIGS. 10A to 10C are sectional views illustrating a process of manufacturing a semiconductor device provided with a driving circuit portion and a pixel portion;

FIGS. 11A to 11C are sectional views illustrating a process of manufacturing a semiconductor device provided with a driving circuit portion and a pixel portion;

DETAILED DESCRIPTION OF THE PREFERRED EMBODIEMNTS

Figure 1:
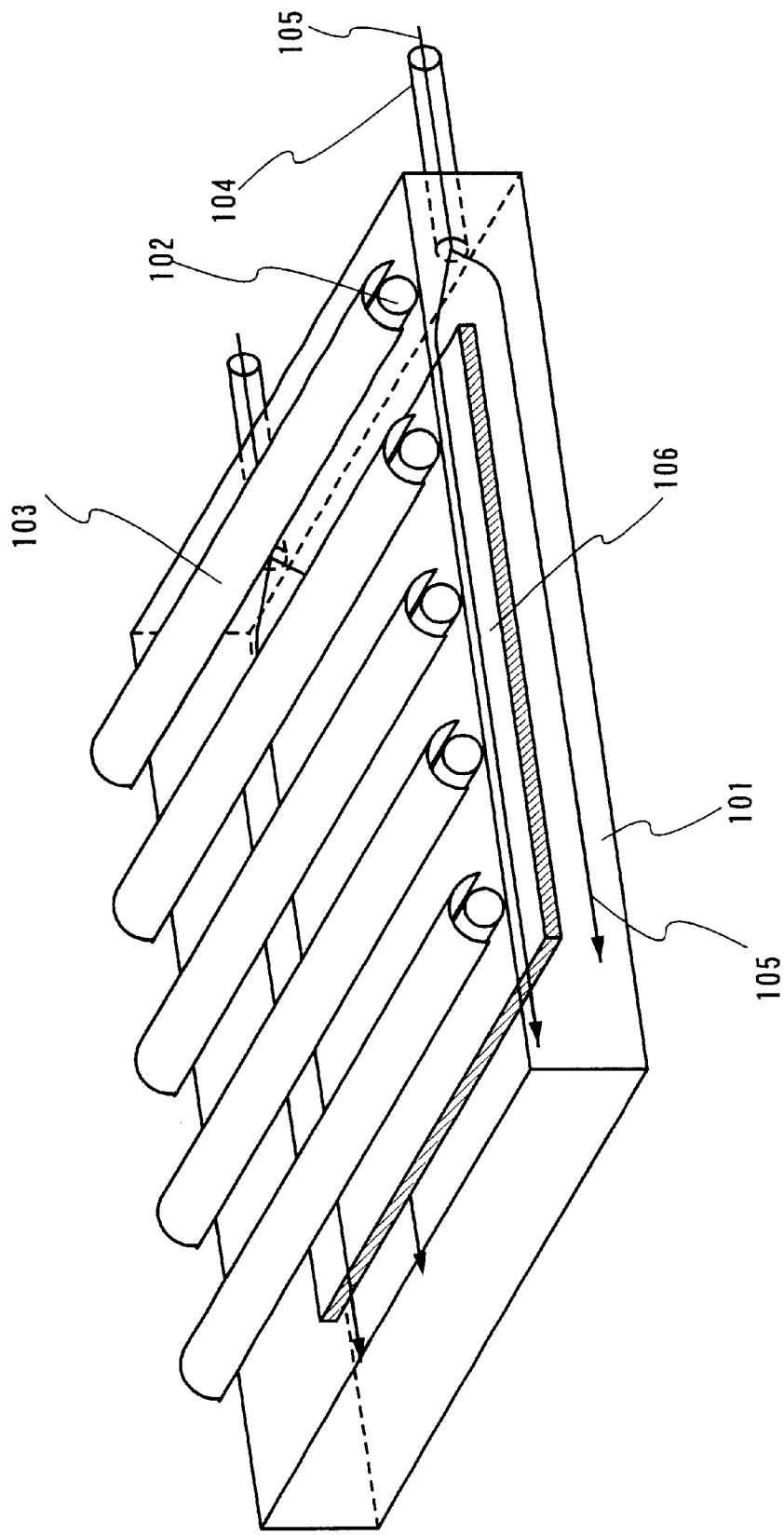
FIG. 1 is a diagram illustrating a heat treatment method of the present invention.

An embodiment mode of the present invention will be described in detail below with reference to the accompanying drawings. Referring to FIG. 1, a description is given on the concept of a heat treatment apparatus according to the present invention. FIG. 1 is a diagram showing the structure of the heat treatment apparatus according to the present invention. A processing chamber 101 is preferably formed of quartz and has a lamp light source 102 as means for heating a treatment object 106. The lamp light source 102 is placed outside the processing chamber 101, and is provided with a reflective plate 103 so that a substrate 106 is efficiently irradiated with the radiated heat. A coolant inlet 104 is provided to cool the substrate 106, and a coolant is introduced to the chamber when the substrate is heated. A coolant 105 may be inert gas such as nitrogen and helium, or a liquid. Desirably, the coolant has high purity. Whatever material is used, the coolant is desirably a medium that absorbs little heat radiated from the lamp light source 102.

Figure 2:
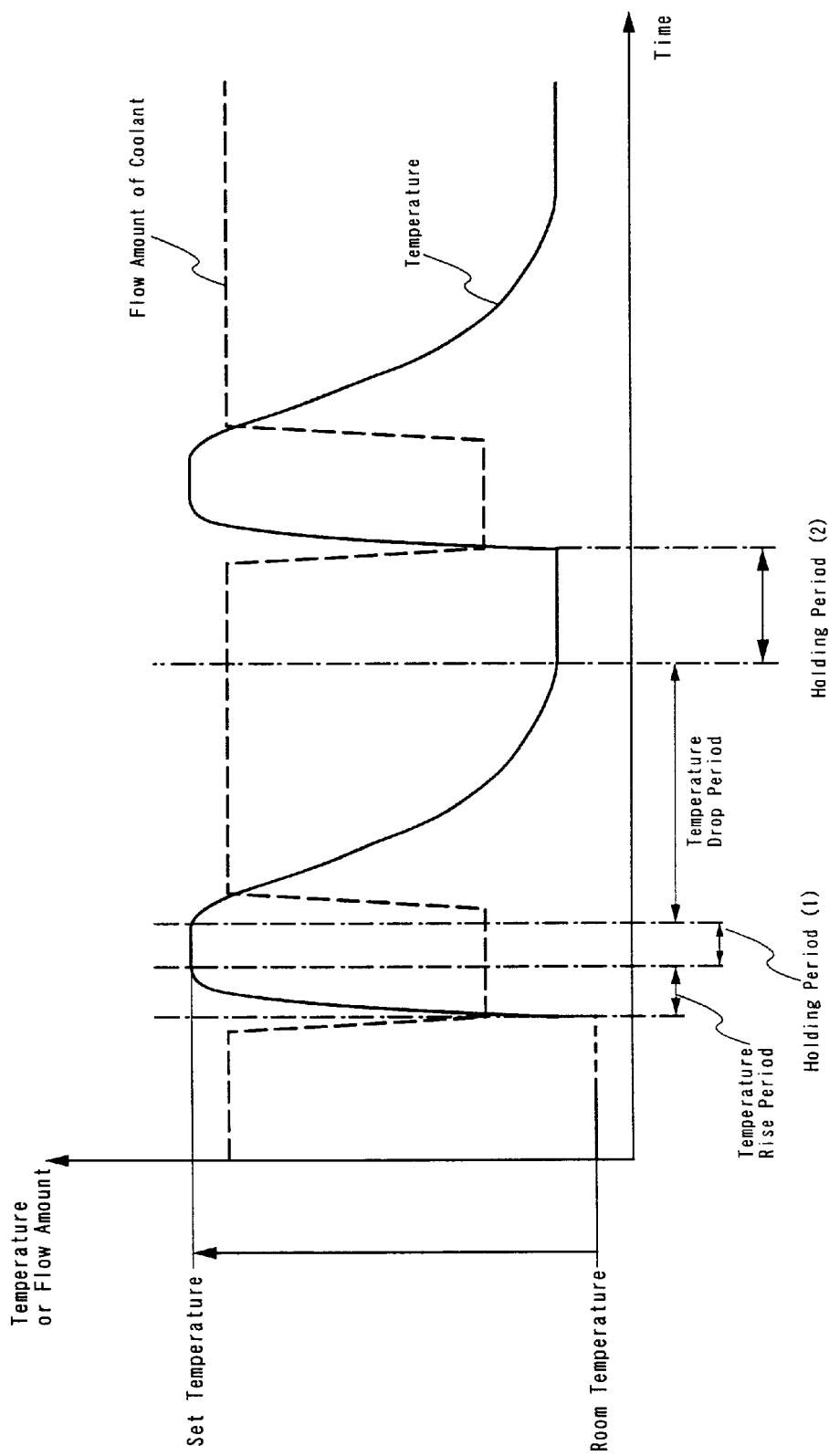
FIG. 2 is a diagram showing how a change in amount of coolant supply is in timing with blinking of a lamp light source.

The lamp light source is lit and made to pulsate by its power source and a control circuit. FIG. 2 shows how the treatment object heated by the lamp light source and the amount of coolant supplied to the processing chamber are controlled. First, the treatment object, which has been kept at room temperature, is rapidly heated by the lamp light source. The temperature of the treatment object is raised at a rate of 100 to 200° C. per second until a set temperature (1100° C., for example) is reached. If the treatment object is heated at a temperature rise rate of 150° C. per second, for instance, it reaches 1100° C. in less than 7 seconds. The set temperature is kept for a given period of time while the lamp light source stops emit light. The given period of time ranges from 0.5 to 5 seconds. Accordingly, the lamp light source emit light continuously for equal to and longer than 0.1 second and shorter than 20 seconds. The amount of coolant supplied is reduced as the lamp light source starts to emit light and increased as the lamp light source stops emitting light. By controlling the amount of coolant supply, how fast the heat treatment object looses temperature is controlled. The temperature drop rate is set to 50 to 150° C. per second. For example, when the treatment object is cooled at a rate of 100° C. per second, the temperature thereof drops from 1100° C. to 300° C. in 8 seconds.

The present invention is characterized by repeating the cycle of heating and cooling several times. The actual heating time is shortened and the lamp light source irradiates a semiconductor film with light that is selectively absorbed by the semiconductor film, so that the semiconductor film alone is selectively heated without giving the substrate too much heat. The pulsative radiation as shown in FIG. 2 heats the semiconductor film and then stops heating before the heat is transmitted to the substrate. Simultaneously, the substrate is cooled by the surrounding coolant and therefore the temperature of the substrate is not raised much. Deformation of the substrate, which has been the problem of any conventional RTA apparatus, thus can be prevented.

Figure 4:
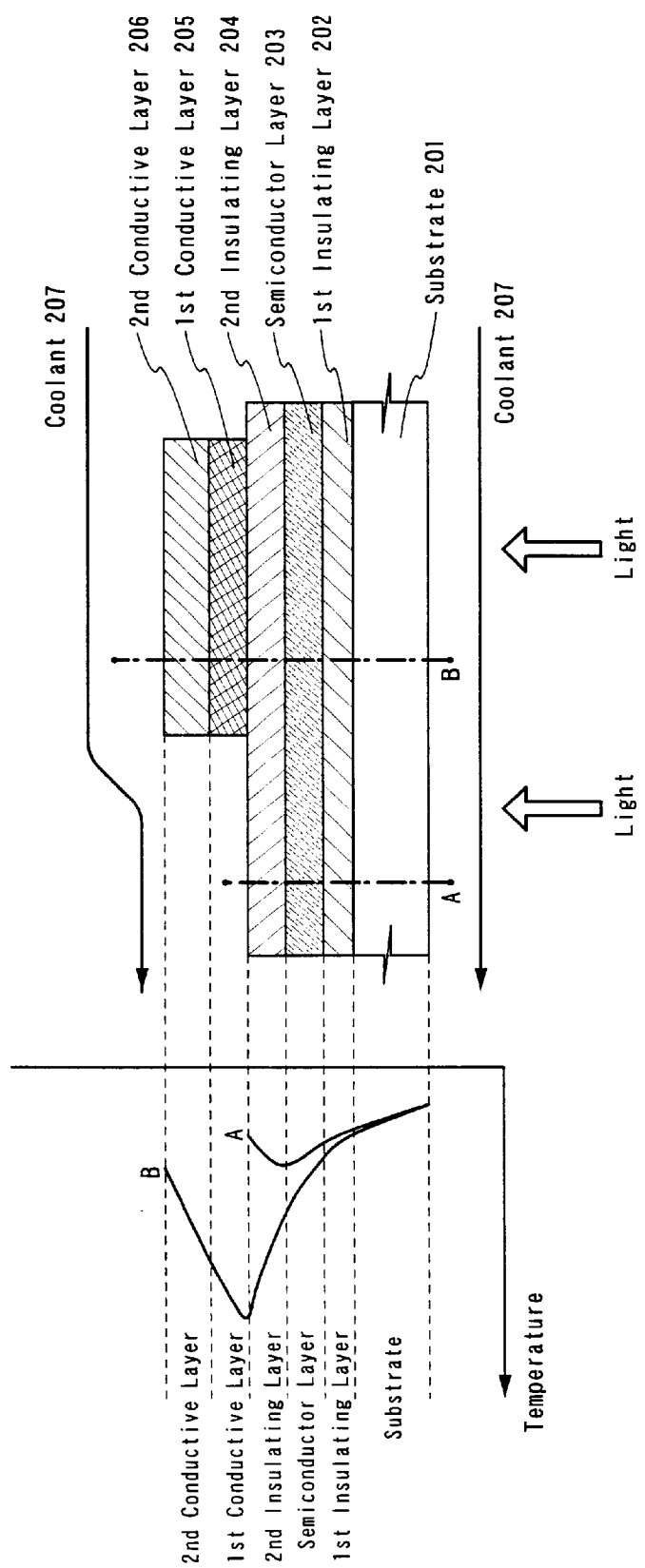
FIG. 4 is a diagram illustrating the mechanism of heat treatment according to the present invention.

As shown in FIG. 4, the treatment object is a light transmissive substrate 201 such as a glass substrate, on which a semiconductor film 203 is formed. On the semiconductor film 203, a conductive layer is formed. The conductive layer may be a single layer but, preferably, consists of a light absorptive first conductive film 205 and a heat conductive second conductive film 206. A first insulating film 202 and a second insulating film 204 are formed on the substrate side and the opposite side of the semiconductor film 203, respectively.

The pulsative radiation from the lamp light source irradiates the semiconductor film from the substrate 201 side. As shown in FIG. 2, the pulsative radiation pulsates for intermittent irradiation. The space surrounding the substrate is filled with a coolant 207 such as nitrogen gas. Due to this pulsative radiation, the temperature of the treatment object is different between a region A and a region B as shown in the graph in FIG. 4.

The pulsative radiation is partially absorbed by the semiconductor film 203 and is converted into heat except the part that is reflected at various interfaces. Light that reaches the light absorptive first conductive film 205 in the region B is absorbed in the region and converted into heat. Some of the heat generated there is transmitted to the semiconductor film 203 through the second insulating film 204. On the other hand, light that has entered the region A is transmitted to the space filled with the coolant 207 through the second insulating film 204. Accordingly, the temperature rises differently between the region A and the region B when the regions receive the pulsative radiation of the same intensity repeatedly. This creates a temperature gradient in the semiconductor film in the direction parallel to the substrate surface (referred to as the horizontal direction for conveniences' sake).

This temperature gradient can be utilized effectively when gettering a channel formation region with the region B as the channel formation region and the region A as an impurity semiconductor region. To be specific, the region A is doped with phosphorus to form an n type semiconductor region and then the region B is gettered and a metal element contained in the region B segregates in the region A by repeating pulsative radiation as shown in FIG. 2.

This gettering effect can be adopted particularly when a semiconductor film is added with a metal element for crystallization and the metal element is to be removed later from a channel formation region thereof.

Because of the conductive film covering the semiconductor film, the temperature of the region of the semiconductor film that is covered with the conductive film (the region B in FIG. 4) is higher than that of the other region of the semiconductor film (the region A in FIG. 4). The configuration shown in FIG. 4 can be translated into a glass substrate on which a semiconductor film, a gate insulating film (corresponding to the second insulating film 204), and a gate electrode (corresponding to the first conductive film 205 and the second conductive film 206) are formed. Then, this configuration may not provide uniform heat treatment effect when applied to a device in which a pixel portion is formed on the same substrate as a driving circuit portion to be provided in the periphery of the pixel portion, as in a liquid crystal display device. The pixel portion and the driving circuit portion are different from each other in TFT density, and TFTs are formed in the driving circuit portion at far greater density than in the pixel portion. Therefore the temperature in the driving circuit portion is raised higher when both the pixel portion and the driving circuit portion receive the pulsative radiation of the same intensity repeatedly.

Figure 6A:
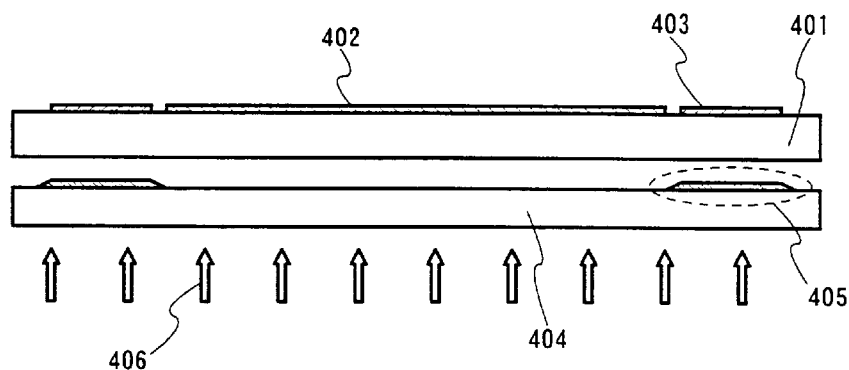
FIGS. 6A to 6C are diagrams illustrating a heat treatment method of the present invention.
Figure 6B:
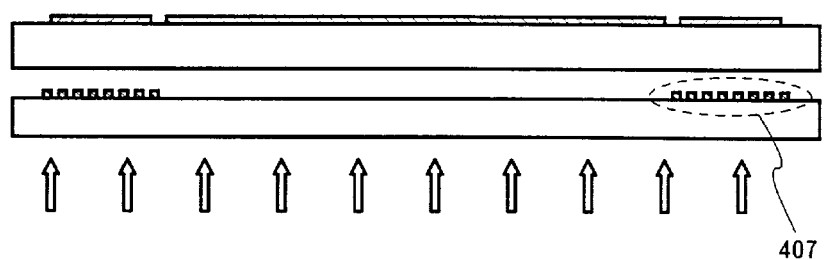
Figure 6C:
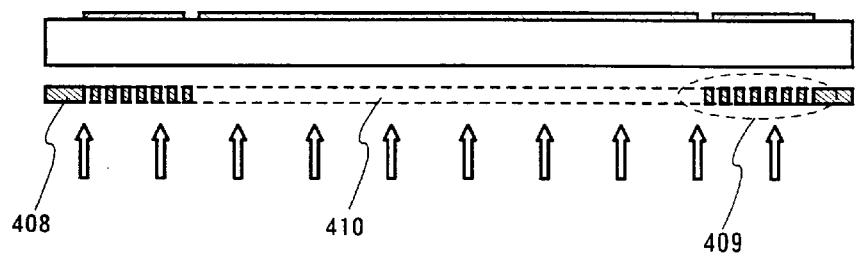

In order to obtain uniform heat treatment effect, light intensity is partially attenuated on the incident side of the pulsative radiation from the lamp light source, as shown in FIGS. 6A to 6C. FIG. 6A shows an example of how to attenuate the pulsative radiation. In FIG. 6A, a pixel portion 402 and a driving circuit portion 403 are formed on a light transmissive substrate 401. On one side of the substrate 401 where pulsative radiation 406 enters the substrate, a semi-transmissive film 405 that is a metal thin film formed of chromium or the like is placed in an area corresponding to the driving circuit portion 403. Then, the pulsative radiation is attenuated. FIG. 6B shows another example of attenuating the pulsative radiation, in which the semi-transmissive film is replaced by a slit portion 407. FIG. 6C shows still another example in which a metal mask 408 has an opening 410 in an area corresponding to the pixel portion and has a slit portion 409 in an area corresponding to the driving circuit portion. The degree of attenuation of the pulsative radiation is set suitably, and is readily adjusted by adjusting the transmittance of the semi-transmissive film or the aperture ratio of the slit portion.

As described above, the present invention provides a method of heat treatment that can activate an impurity element used to dope a semiconductor film and perform gettering on the semiconductor film in a short period of time without deforming a substrate even if it is a low heat resistant substrate such as a glass substrate. This heat treatment can be incorporated in a process of manufacturing a semiconductor device.

Embodiment 1

Figure 5:
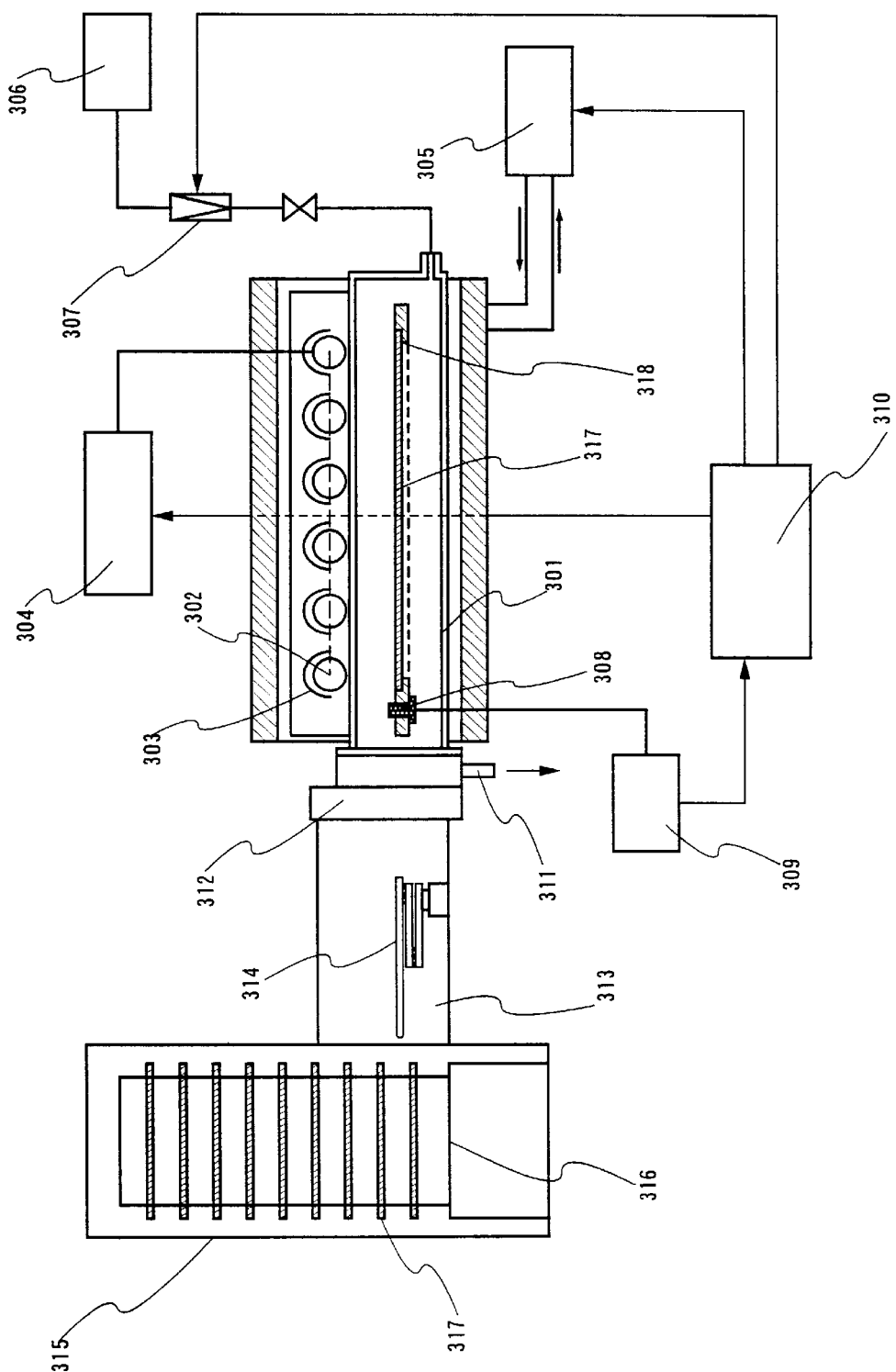
FIG. 5 is a diagram illustrating the structure of a heat treatment apparatus according to the present invention.

FIG. 5 shows the structure of a single wafer type heat treatment apparatus as an example of a heat treatment apparatus of the present invention. A processing chamber 301 is formed of quartz and is surrounded by water-cool type cooling means 305. A lamp light source 302 has a reflective plate 303 so that pulsative radiation diffuses over a treatment object 317 efficiently. When a rod-like halogen lamp is used, a plurality of lamps are set as shown in FIG. 5 to irradiate the treatment object 317 with pulsative radiation of uniform intensity. Radiation (including a wavelength of 0.5 $\mu$m to 3 $\mu$m, for example) is made to pulsate by a light source control unit 304.

Nitrogen gas is supplied as a coolant to the processing chamber 301 from a coolant supply source 306. The amount of nitrogen gas to be supplied to the processing chamber 301 can be controlled by flow rate controlling means 307. The coolant supplied to the processing chamber is then discharged from an outlet 311 so that the processing chamber is always filled with clean nitrogen gas. A temperature detector 309 is comprised of a temperature sensor 308 that is a radiation thermometer and is provided to monitor the temperature of the treatment object that is heated by pulsative radiation from the lamp light source. For that reason, the temperature sensor 308 is placed on a part of a stage 318.

Control means 310 controls the operation of the light source controlling unit 304 and the flow rate controlling means 307 such that blinking of the lamp light source is synchronized with increase or reduction of the amount of coolant supply as shown in FIG. 2. The control means 310 also receives a signal from the temperature detector 309 to detect the temperature of the treatment object and determine whether there is a trouble or not.

The treatment object is set in a substrate holder 316 in a loading/unloading chamber 315, and then transferred to the processing chamber 301 by transferring means 314 of a transfer chamber 313. A gate valve 312 is provided between the transfer chamber 313 and the processing chamber 301 to allow the coolant to fill the processing chamber 301 during heat treatment.

An impurity element used to dope a semiconductor film is activated by the following procedure. The semiconductor film is formed on one major surface of a glass substrate. The treatment object having the semiconductor film is set in the loading/unloading chamber 315, and then taken out of the substrate holder 316 by the transferring means 314 of the transfer chamber 313 to be set on the stage 318 of the processing chamber 301. The treatment object is set on the stage such that the semiconductor film faces the opposite side of the lamp light source 302. In other words, the semiconductor film receives radiation through the glass substrate.

Thereafter, the gate valve 312 is closed. The flow rate controlling means 307 keeps supplying the processing chamber that has a volume of 18×30×1.5 cm$^3$ with the coolant at a flow rate of 1 to 2 liters per minute. After the gate valve 312 is closed, the flow rate controlling means increases the amount of coolant supply to 10 to 20 liters per minute and holds the rate for a given period of time, so that the atmosphere of the processing chamber is substituted with the coolant, i.e., nitrogen gas.

Figure 3:
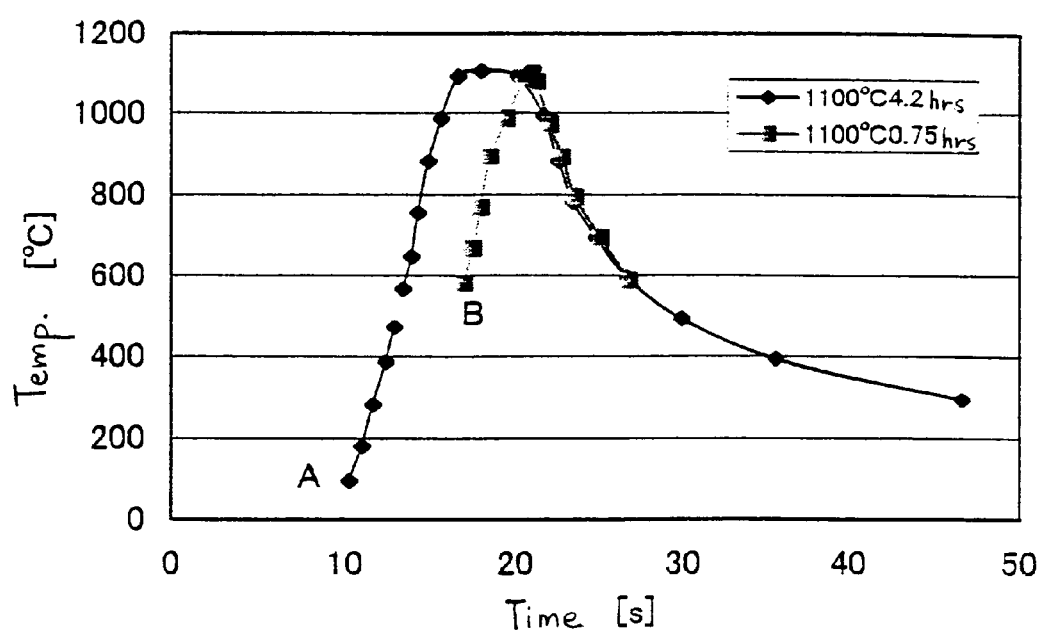
FIG. 3 is a graph showing a temperature change in an irradiation object region due to pulsative radiation from a lamp light source.

As the lamp light source starts to emit light, the amount of nitrogen gas supplied is reduced to 2 liters per minute. The treatment object is heated by the lamp light source at a rate of 100 to 200° C. per second until it reaches 1100° C. based on the temperature detected by the temperature sensor 308. Then, heating is controlled so that the treatment object is kept at 1100° C. for 0.5 to 5 seconds. The lamp light source is then turned off and the flow rate of nitrogen gas is raised to 10 liters per minute to cool the treatment object down to 300 to 400° C. at a rate of 50 to 150° C. per second. This state may last 5 to 60 seconds (corresponding to a holding period (2) in FIG. 2). FIG. 3 is a graph obtained by plotting a change with time in temperature detected by the temperature sensor. Shown in FIG. 3 is data of when the treatment object is kept at 1100° C. for 4.2 seconds and data of when it is kept for 0.75 seconds. Table 1 and Table 2 contain numerical data for the graph of FIG. 3 and show the temperature measured at various time points and the rate of temperature change.

TABLE 1

| | Time [s] | Temp. [° C.] | Rate of Temp. Change [° C./s] |
|---|---|---|---|
| Heating | 10.25 | 93.30 | 115.60 |
| Process | 11.00 | 180.00 | 161.29 |
| | 11.62 | 280.00 | 140.39 |
| | 12.38 | 386.70 | 173.20 |
| | 12.88 | 473.30 | 187.40 |
| | 13.38 | 567.00 | 159.40 |
| | 13.88 | 646.70 | 288.11 |
| | 14.25 | 753.30 | 201.11 |
| | 14.88 | 880.00 | 144.19 |
| | 15.62 | 986.70 | 106.60 |
| Holding | 16.62 | 1093.30 | 9.71 |
| Process | 18.00 | 1106.70 | −6.32 |
| | 20.12 | 1093.30 | −66.67 |
| Cooling | 21.62 | 993.30 | −128.75 |
| Process | 22.50 | 880.00 | −113.64 |
| | 23.38 | 780.00 | −63.28 |
| | 24.75 | 693.30 | −53.48 |

TABLE 1-continued

| Time [s] | Temp. [° C.] | Rate of Temp. Change [° C./s] |
|---|---|---|
| 26.62 | 593.30 | −30.67 |
| 29.88 | 493.30 | −17.79 |
| 35.50 | 393.30 | −8.99 |
| 46.62 | 293.30 | |

TABLE 2

| | Time [s] | Temp. [° C.] | Rate of Temp. Change [° C./s] |
|---|---|---|---|
| Heating | 17.00 | 580.00 | 173.40 |
| Process | 17.50 | 666.70 | 200.00 |
| | 18.00 | 766.70 | 253.20 |
| | 18.50 | 893.30 | 93.40 |
| | 19.50 | 986.70 | 106.60 |
| | 20.50 | 1093.30 | 26.80 |
| Holding | 20.75 | 1100.00 | 0.00 |
| Process | 21.00 | 1100.00 | −80.00 |
| Cooling | 21.25 | 1080.00 | −142.27 |
| Process | 22.00 | 973.30 | −106.67 |
| | 22.75 | 893.30 | −133.33 |
| | 23.50 | 793.30 | −66.67 |
| | 25.00 | 693.30 | −60.91 |
| | 26.75 | 586.70 | 21.93 |

Bending of the substrate can be avoided by irradiating the substrate several times through pulsative radiation described above. This applies to the case of activating an impurity element used to dope a semiconductor film and the case of gettering the semiconductor film both.

Embodiment 2

Figure 16:
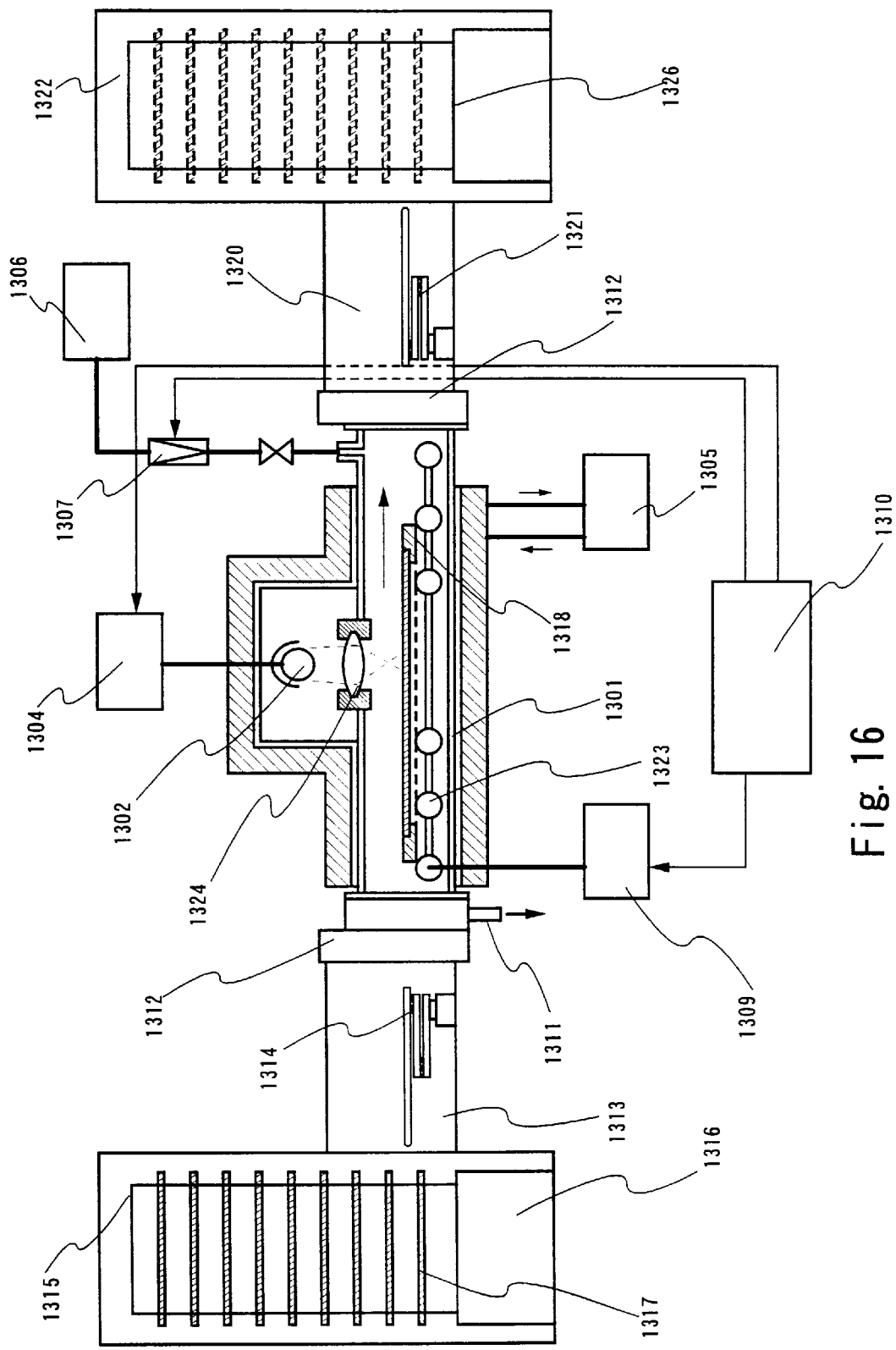
FIG. 16 is a diagram illustrating the structure of a heat treatment apparatus according to the present invention.

As an example of a heat treatment apparatus of the present invention, the structure of an inline type heat treatment apparatus that corresponds to a substrate having a large area is shown in FIG. 16. A processing chamber 1301 is formed of quartz and is surrounded by water-cool type cooling means 1305. A lamp light source 1302 has a reflective plate so that an optical lens 1324 condenses light to irradiate a treatment object. A rod-like halogen lamp is used in a lamp light source 1302, and a cylindrical lens is used as the optical lens 1324, thereby being capable of irradiating the treatment object with a linear light. A lamp light source is lit and made to pulsate by a light source control unit 1304.

Nitrogen gas or helium gas is supplied as a coolant to the processing chamber 1301 from a coolant supply source 1306. The amount of nitrogen gas to be supplied to the processing chamber 1301 can be controlled by a flow rate controlling means 1307. The coolant supplied to the processing chamber is then discharged outside from an outlet 1311 so that the processing chamber is always filled with clean nitrogen gas.

Control means 1310 controls the operation of the light source controlling unit 1304, the flow rate controlling means 1307 and a transferring means 1323 of a treatment object 1317 and a stage 1318 in the processing chamber, such that blinking of the lamp light source is synchronized with increase or reduction of the supply amount of coolant, as shown in FIG. 2. The control means 1310 also controls the timing in which the stage 1318 moves.

The treatment object is put on the stage and is set in a holder 1316 in a loading chamber 1315, and then transferred to the processing chamber 1301 by a transferring means 1314 of a transfer chamber 1313. A gate valve 1312 is provided between the transfer chamber 1313 and the processing chamber 1301 to allow the coolant to fill the processing chamber 1301 during heat treatment.

A treatment object 1317 is irradiated with pulsative radiation from the lamp light source 1302 while placed on the stage 1318 and moved by the transferring means 1323 of the processing chamber 1301. The entire surface of the treatment object thus receives heat treatment. After finishing the heat treatment, the treatment object 1317 is moved to a transfer chamber 1320 along with the stage 1318 by transferring means 1321. Thereafter, the treatment object is received by a holder 1326 in an unloading chamber 1322.

The treatment object is heated in a manner similar to the treatment in Embodiment 1. However, since the treatment object is moved along in the apparatus structured as shown in FIG. 16, the movement has to be in timing with the pulsative radiation. The flow rate of nitrogen gas used as the coolant is controlled similarly. The treatment object is moved during the holding period (2) shown in FIG. 2, and it is a phased progress. How far the treatment object moves at a time can be set suitably, but the movement has to be one that allows the pulsative radiation to irradiate the same region several times.

With this structure, the size of apparatus does not need to be very large to perform heat treatment on a large-area substrate. Bending of the substrate can be avoided and the gettering can be performed by irradiating the substrate several times through pulsative radiation described above. This applies to the case of activating an impurity element used to dope a semiconductor film and the case of gettering the semiconductor film both.

Embodiment 3

Figure 7A:
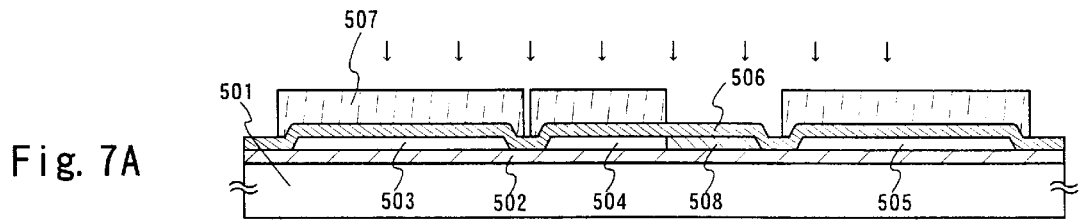
FIGS. 7A to 7F are sectional views illustrating a method of manufacturing TFTs.

An example of a method of manufacturing TFTs using the present invention will be described with reference to FIGS. 7A to 7F. In FIG. 7A, a crystalline semiconductor film mainly containing silicon is formed on a light transmissive substrate 501 formed of alminoborosilicate glass or barium borosilicate glass. The crystalline semiconductor film is obtained by crystallizing an amorphous semiconductor film through laser annealing. Instead, the heat treatment apparatus described in Embodiment 1 or Embodiment 2 may be used to crystallize an amorphous semiconductor film through pulsative radiation. The crystalline semiconductor film formed has a thickness of 25 to 80 nm. To manufacture TFTs, the crystalline semiconductor film is etched and divided into films having given sizes for element separation. Thus formed are island-like semiconductor films 503 to 505. A first insulating film 502 with a thickness of 50 to 200 nm is formed between the substrate 501 and the semiconductor films. The first insulating film is formed of one selected from the group consisting of silicon nitride, silicon oxide, and silicon oxynitride, or a combination thereof.

For example, the first insulating film 502 may be a silicon oxynitride film formed by plasma CVD from $SiH_4$ and $N_2O$ to have a thickness of 50 to 200 nm. The first insulating film 502 may also take a two-layer structure consisting of a silicon oxynitride film that is formed by plasma CVD from $SiH_4$, $NH_3$, and $N_2O$ to have a thickness of 50 nm and a silicon oxynitride film that is formed by plasma CVD from $SiH_4$ and $N_2O$ to have a thickness of 100 nm. Another example of the two-layer structure for the first insulating film consists of a silicon nitride film and a silicon oxide film that is formed from TEOS (tetraethyl ortho silicate).

On the semiconductor films 503 to 505, a silicon oxide film 506 is formed by plasma CVD to have a thickness of 100 nm. A mask 507 is formed thereon from a resist to dope the semiconductor film 504 with an n type impurity element (donor). As a result, a first n type semiconductor region 508 is formed in the semiconductor film 504 as shown in FIG. 7A. The n type impurity (donor) typically used is phosphorus, and the phosphorus concentration in the first n type semiconductor region 508 is $1\times10^{17}$ to $1\times10^{19}$ atoms/$cm^3$ on the average. The silicon oxide film 506 is used here as a mask for controlling the phosphorus concentration.

Accordingly, the silicon oxide film 506 is removed using fluoric acid and the like after the doping. A second insulating film 509 is then formed to have a thickness of 80 nm. The second insulating film 509 is used as a gate insulating film and formed by plasma CVD or sputtering. If the second insulating film 509 is a silicon oxynitride film formed by adding $O_2$ to $SiH_4$ and $N_2O$, it makes a preferable gate insulating film since the fixed electric charge density in the film is low. Needless to say, the gate insulating film is not limited to the silicon oxynitride film as this and may be a single layer or a laminate of insulating films such as a silicon oxide film and a tantalum oxide film.

On the second insulating film 509, a first conductive film and a second conductive film constituting gate electrodes are formed. The first conductive film is a light absorptive conductive film. An example of such conductive film is a tantalum nitride film, and one having a thickness of 50 to 100 nm is used here. The second conductive film is formed of a high melting point metal such as tungsten and molybdenum and has a thickness of 100 to 300 nm. These materials are stable and their resistivity does not increase much during heat treatment at 400 to 600° C. in a nitrogen atmosphere.

Figure 7B:
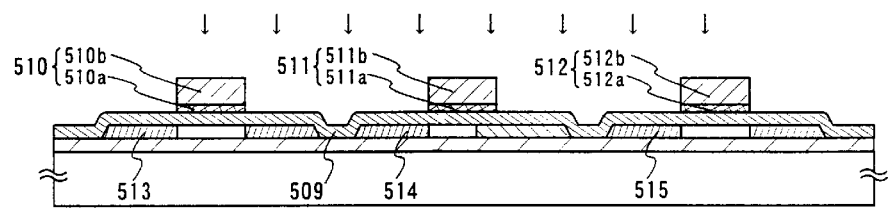

Next, the first conductive film and the second conductive film are etched to form gate electrodes 510 to 512 (the gate electrode 510 is composed of a first conductive film 510a and a second conductive film 510b, the gate electrode 511 is formed of a first conductive film 511a and a second conductive film 511b, and the gate electrode 512 is formed of a first conductive film 512a and a second conductive film 512b) as shown in FIG. 7B. The etching method is not particularly limited but, preferably, ICP (inductively coupled plasma) etching is employed. A mixture gas of $CF_4$ and $Cl_2$ is used as the etching gas in this etching.

After the gate electrodes are formed, the semiconductor films 503 to 505 are doped with an n type impurity (donor) by ion doping while using the gate electrodes as masks. Thus formed are second n type semiconductor regions 513 to 515. The phosphorus concentration in the second n type semiconductor regions 513 to 515 is $1\times10^{16}$ to $1\times10^{18}$ atoms/$cm^3$ on the average. However, the second n type semiconductor regions have to be doped with the impurity in a concentration lower than the impurity concentration in the first n type semiconductor region. Therefore, the first n type semiconductor region formed in the semiconductor film 504 remains as it is.

Figure 7C:
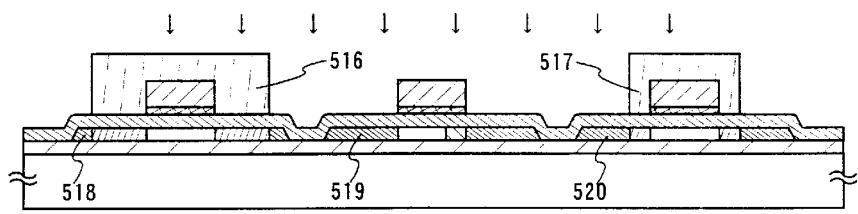

Subsequently, masks 516 and 517 are formed from a resist on the semiconductor films 503 and 505 as shown in FIG. 7C. Then, the semiconductor films are again doped with the n type impurity (donor) by ion doping, thereby forming third n type semiconductor regions 518 to 520. The phosphorus concentration in the third n type semiconductor regions is $1\times10^{20}$ to $1\times10^{21}$ atoms/$cm^3$ on the average. At this point, a part of the first n type semiconductor region 508 in the semiconductor film 504 is remained in a region overlapping the gate electrode. A part of the second n type semiconductor region 515 in the semiconductor film 505 is remained in a region overlapping the mask 517.

Figure 7D:
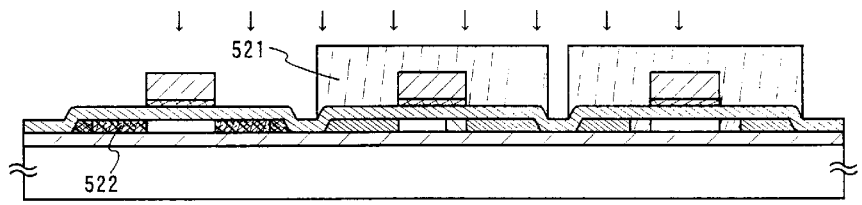

As shown in FIG. 7D, a mask 521 is then formed from a resist to dope the semiconductor film 503 for forming a p-channel TFT with a p type impurity (acceptor). The p type impurity typically used is boron (B). Thus formed is a first p type semiconductor region 522, which has an impurity concentration of $2\times10^{20}$ to $2\times10^{21}$ atoms/cm$^3$. The concentration of boron used here is 1.5 to 3 times the concentration of phosphorus that has already been contained in this region, so that the conductivity of the region is inverted from n type to p type.

Figure 7E:
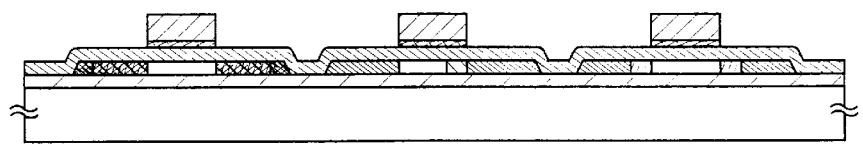

In FIG. 7E, the impurities used in doping are activated by heat treatment. The heat treatment is carried out by using the heat treatment apparatus described in Embodiment 1 or Embodiment 2, and the impurities are activated by irradiating the semiconductor films several times through pulsative radiation. Since the irradiation is performed from the substrate side, the p type and n type impurity elements can be activated without fail throughout the entire semiconductor films, even in the first n type semiconductor region that overlaps the gate electrode.

Figure 7F:
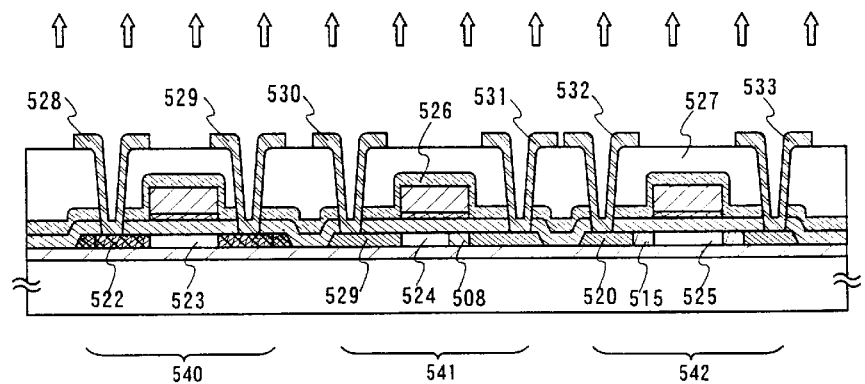

Through the above steps, doping of the semiconductor films with impurities to form source or drain regions and LDD regions in the respective semiconductor films is completed, as well as activation of the impurities. Thereafter, a protective insulating film 526 is formed from a silicon nitride film or a silicon oxynitride film by plasma CVD as shown in FIG. 7F. Heat treatment is then conducted at 350 to 450° C., preferably, 410° C. Hydrogen in a first interlayer insulating film is released at this temperature and the semiconductor film is hydrogenated. Therefore, heat treatment using a furnace annealing or a clean oven is more suitable for this purpose.

An interlayer insulating film 527 is formed from an organic insulating material such as polyimide and acrylic to level the surface. A silicon oxide film formed by plasma CVD from TEOS (tetraethyl ortho silicate) may of course be used instead, but the organic resin material is preferable for superior flatness.

Next, contact holes are formed and source or drain wiring lines 528 to 533 are formed from aluminum (Al), titanium (Ti), tantalum (Ta), or the like.

A p-channel TFT 540 manufactured through the above steps has a channel formation region 523 and the first p type semiconductor region 522 that functions as a source or drain region. An n-channel TFT 541 has a channel formation region 524, the first n type semiconductor region 508 that overlaps the gate electrode 511, and the third n type semiconductor region 519 that functions as a source or drain region. The first n type semiconductor region is an LDD region which, when overlapping a gate electrode, can ease the high electric field region generated in an end of the drain and prevent degradation of the TFT due to the hot carrier effect. An n-channel TFT 542 has a channel formation region 525, the second n type semiconductor region 515 that is formed outside the gate electrode 512, and the third n type semiconductor region 520 that functions as a source or drain region. The second n type semiconductor region 515 is an LDD region and can reduce OFF current of the TFT. The manufacture process shown in this embodiment allows the dimensions to be set to values optimal for reducing the OFF current value.

Thus obtained is a CMOS TFT in which an n-channel TFT and a p-channel TFT are combined complementarily. The manufacture process shown in this embodiment allows an operator to design LDD regions taking into consideration characteristics required for the respective TFTs, so that TFTs on the same substrate can have individually optimal structures. This CMOS TFT can make a driving circuit of an active matrix-driven display device. The n-channel TFT or the p-channel TFT of this CMOS TFT is adaptable as a transistor constituting a pixel portion. It can be used also as a TFT for making a thin film integrated circuit that is to replace LSI fabricated from a conventional semiconductor substrate. The TFTs shown here has a single gate structure but may of course take a multi-gate structure in which a plurality of gate electrodes are provided.

In this manufacture process for TFTs, the heat treatment apparatus of the present invention can be used to conduct activation. Activation by the heat treatment method of the present invention takes only a short period of time and does not damage a substrate.

Embodiment 4

This embodiment describes, as an example of a semiconductor device manufacturing method using a heat treatment apparatus of the present invention, a method of forming a driving circuit and a pixel portion on the same substrate. The driving circuit is composed of an n-channel TFT and a p-channel TFT, and the description will be given with reference to FIGS. 10A to 12B.

Formed first on a substrate 601 as shown in FIG. 10A is a first insulating film 602. The first insulating film 602 has a two-layer structure consisting of a silicon oxynitride film that is formed by plasma CVD from SiH$_4$, NH$_3$, and N$_2$ to have a thickness of 50 nm and a silicon oxynitride film that is formed by plasma CVD from SiH$_4$ and N$_2$O to have a thickness of 100 nm. A substrate appropriate to use here is an aluminoborosilicate glass, barium borosilicate glass, or other non-alkaline glass substrate. The thickness of the substrate is about 0.5 to 1.1 mm.

Semiconductor films 603 to 606 are formed thereon to have a thickness of 40 nm. The semiconductor films are polycrystalline silicon obtained by crystallizing, through laser annealing or a solid phase growth method, amorphous silicon that is deposited by plasma CVD or low pressure CVD. Alternatively, the heat treatment apparatus described in Embodiment 1 or Embodiment 2 may be used to crystallize the amorphous silicon through pulsative radiation. After subjected to light exposure, the semiconductor films are divided into island-like semiconductor films. Hereinafter, the description of this embodiment is given on the premise that the semiconductor film 603 is used to form a p-channel TFT and the semiconductor films 604 and 605 are used to form n-channel TFTs. The semiconductor film 606 is used to form an auxiliary capacitor.

A second insulating film 607 with a thickness of 75 nm is formed so as to cover the semiconductor films. The second insulating film serves as a gate insulating film. Silicon oxide made from TEOS (tetraethyl ortho silicate) or silicon oxynitride made from SiH$_4$ and N$_2$O is used to form the second insulating film and plasma CVD is employed for the formation.

Next, a first conductive film 608 and a second conductive film 609 are formed on the second insulating film as shown in FIG. 10B. The first conductive film 608 is formed of tantalum nitride whereas the second conductive film 609 is formed of tungsten. The conductive films constitute gate electrodes. The first conductive film is 30 nm thick and the second conductive film is 300 nm thick.

Thereafter, a resist pattern 610 for forming the gate electrodes and data lines is formed through light exposure as shown in FIG. 10C. The resist pattern is used in first etching treatment. The etching method is not particularly limited but, preferably, ICP (inductively coupled plasma) etching is employed. While using $CF_4$ and $Cl_2$ as etching gas for tungsten and tantalum nitride, an RF (13.56 MHz) power of 500 W is given to a coiled electrode at a pressure of 0.5 to 2 Pa, preferably 1 Pa, to generate plasma. At this point, the substrate side (stage) also receives an RF (13.56 MHz) power of 100 W so that substantially negative self-bias voltage is applied. When a mixture of $CF_4$ and $Cl_2$ is used as the etching gas, tungsten and tantalum nitride are etched at almost the same rate.

Under the above etching conditions, the conductive films are tapered around the edges owing to the shape of the resist mask and the effect of the bias voltage applied to the substrate side. The angle of the tapered portion is set to 15 to 45°. In order to etch the conductive films without leaving any residue on the gate insulating film, the etching time is prolonged by about 10 to 20%. Since the selective ratio of a silicon oxynitride film to a W film is 2 to 4 (typically, 3), the surface where the second insulating film is exposed is etched by about 20 to 40 nm through the over-etching treatment. Thus formed through the first etching treatment are first shape electrodes 611 to 614 (the first shape electrode 611 is composed of a tantalum nitride film 611a and a tungsten film 611b, 612 is composed of a tantalum nitride film 612a and a tungsten film 612b, 613 is composed of a tantalum nitride film 613a and a tungsten film 613b, and 614 is composed of a tantalum nitride film 614a and a tungsten film 614b,) and a first shape wiring line 615 (composed of a tantalum nitride film 615a and a tungsten film 615b).

Then, first doping treatment is conducted to dope the semiconductor films with an n type impurity (donor). Ion doping or ion implantation is used. When ion doping is chosen, the dose is set to $1 \times 10^{13}$ to $5 \times 10^{14}$ atoms/cm². An impurity element that imparts the n type conductivity is a Group 15 element, typically phosphorus (P) or arsenic (As). In the first doping, the first shape electrodes 611 to 614 serve as masks against the dopant. The acceleration voltage is adjusted suitably (to 20 to 60 keV, for example) so that the semiconductor films are doped with the impurity element passing through the second insulating film. As a result, first impurity regions 616 to 619 are formed. The phosphorus (P) concentration in the first impurity regions 616 to 619 is $1 \times 10^{20}$ to $1 \times 10^{21}$ atoms/cm³.

Subsequently, second etching treatment is conducted as shown in FIG. 11A. In the second etching treatment, ICP etching is employed, $CF_4$, $CL_2$, and $O_2$ are mixed as etching gas, and an RF (13.56 MHz) power of 500 W is given to a coiled electrode at a pressure of 1 Pa to generate plasma. The substrate side (stage) receives an RF (13.56 MHz) power of 50 W to apply a self-bias voltage lower than that in the first etching treatment. Under these conditions, the tungsten film is subjected to anisotropic etching to leave the tantalum nitride film that is the first conductive film. Formed through the second etching treatment are second shape electrodes 620 to 623 (the second shape electrode 620 is composed of a tantalum nitride film 620a and a tungsten film 620b, 621 is composed of a tantalum nitride film 621a and a tungsten film 621b, 622 is composed of a tantalum nitride film 622a and a tungsten film 622b, and 623 is composed of a tantalum nitride film 623a and a tungsten film 623b) and a second shape wiring line 624 (composed of a tantalum nitride film 624a and a tungsten film 624b). Portions of the second insulating film that are not covered with the tantalum nitride films are etched and thinned by about 10 to 30 nm through the second etching treatment.

In second doping treatment, the dose is smaller than that in the first doping treatment and the acceleration voltage is set high to dope the semiconductor films with an n type impurity (donor). For instance, the acceleration voltage is set to 70 to 120 keV and the dose is set to $1 \times 10^{13}$ atoms/cm². As a result, second impurity regions are formed inside the first impurity regions. The semiconductor films under the exposed tantalum nitride films 620a to 623a are doped with the impurity element that has passed through the films 620a to 623a. The second impurity regions, denoted by 625 to 628, thus overlap the tantalum nitride films 620a to 623a. Although the impurity concentration in the second impurity regions fluctuates in accordance with the thickness change, the peak concentration is $1 \times 10^{17}$ to $1 \times 10^{19}$ atoms/cm³. The n type impurity depth distribution is not uniform in the second impurity regions.

As shown in FIG. 11B, a resist mask 629 is formed next through light exposure so as to cover the second shape gate electrode 621, and the tantalum nitride films of the other exposed second shape electrodes are selectively etched. A mixture of $Cl_2$ and $SF_6$ is used as the etching gas. Formed as a result are third shape electrodes 630 to 632 in which the ends of the tungsten films coincide with the ends of the tantalum nitride films. The data line may simultaneously be processed to form a third shape wiring line 633.

Then, masks 634 and 635 are formed from a resist as shown in FIG. 11C to dope the semiconductor films 603 and 606 with a p type impurity (acceptor). The p type impurity is typically boron (B). Thus formed is first p type semiconductor regions 636 and 637, which have an impurity concentration of $2 \times 10^{20}$ to $2 \times 10^{21}$ atoms/cm³. The concentration of boron used here is 1.5 to 3 times the concentration of phosphorus that has already been contained in the regions, so that the conductivity of the regions is inverted from n type to p type.

Through the above steps, the impurity regions are formed in the respective semiconductor films. The second shape electrode 621 and the third shape electrodes 630 to 632 serve as gate electrodes. The third shape wiring line 633 makes a data line. The gate electrode 632 is one of electrodes that constitute an added capacitor, and overlaps the semiconductor film 606 to form the capacitor in the overlapping portion.

Figure 12A:
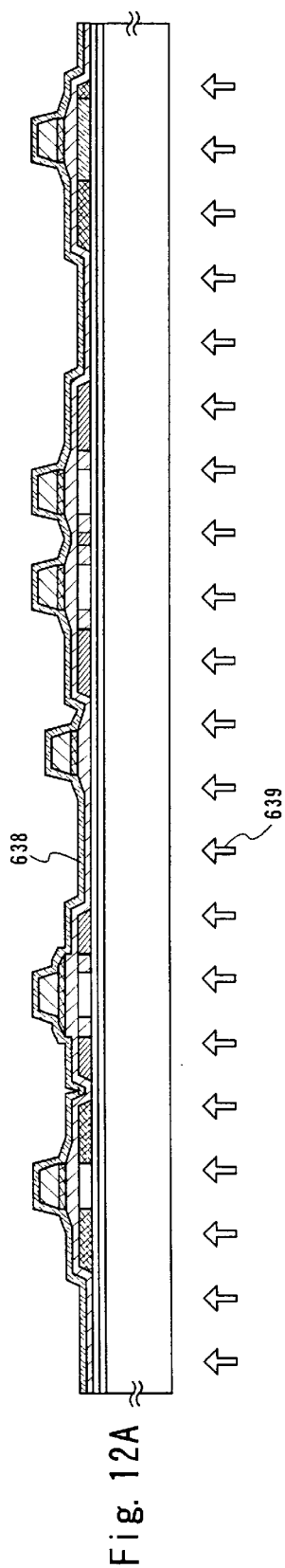
FIGS. 12A and 12B are sectional views illustrating a process of manufacturing a semiconductor device provided with a driving circuit portion and a pixel portion.

Thereafter, a protective insulating film 638 is formed from a silicon oxynitride film by plasma CVD to have a thickness of 50 nm as shown in FIG. 12A. Then, the impurities used in doping are activated through heat treatment. The heat treatment is carried out by using the heat treatment apparatus described in Embodiment 1 or Embodiment 2, and the impurities are activated by irradiating the semiconductor films several times through pulsative radiation. Since the irradiation is made from the substrate side, the p type and n type impurity elements can be activated without fail throughout the entire semiconductor films, even in the first n type semiconductor regions that overlap the gate electrode.

Figure 12B:
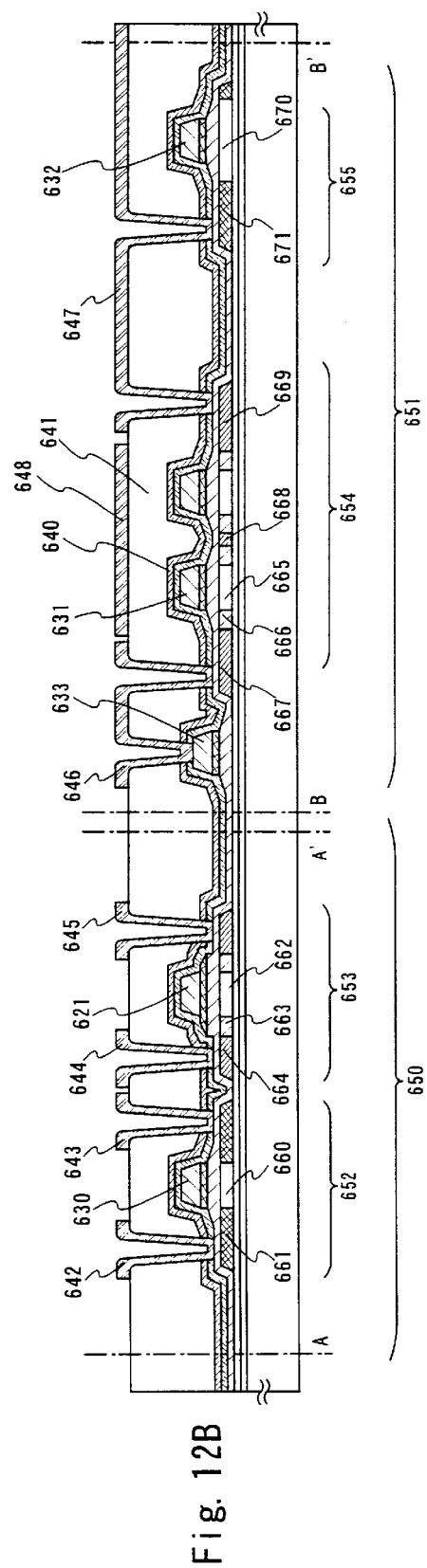

Hydrogenation treatment is necessary to improve the TFT characteristics, and is carried out by heat treatment or plasma treatment in a hydrogen atmosphere. There is another hydrogenation method, which is shown in FIG. 12B. In this method, a silicon nitride film 640 is formed to have a thickness of 50 to 100 nm and then subjected to heat treatment at 350 to 500° C. Hydrogen is thus released from the silicon nitride film 640 and diffuses to the semiconductor films to hydrogenate them and repair defects.

An interlayer insulating film 641 is formed from an organic insulating material such as polyimide and acrylic to level the surface. A silicon oxide film formed by plasma CVD from TEOS (tetraethyl ortho silicate) may of course be used instead, but the organic material is preferable for superior flatness.

Formed next are contact holes starting from the surface of the interlayer insulating film 641 and reaching the second n type semiconductor regions or the first p type semiconductor regions of the respective semiconductor films. Then, wiring lines are formed from Al, Ti, Ta, or the like. In FIG. 12B, 642 and 645 denote source wiring lines whereas 643 and 644 denote drain wiring lines. Denoted by 647 is a pixel electrode and 646 is a connector electrode that connects the data line 633 with a second n type semiconductor region 667 of the semiconductor film 605. 648 is a gate wiring line and, though not shown in the drawing, is connected to the third shape electrode 631 functioning as a gate electrode.

Figure 13:
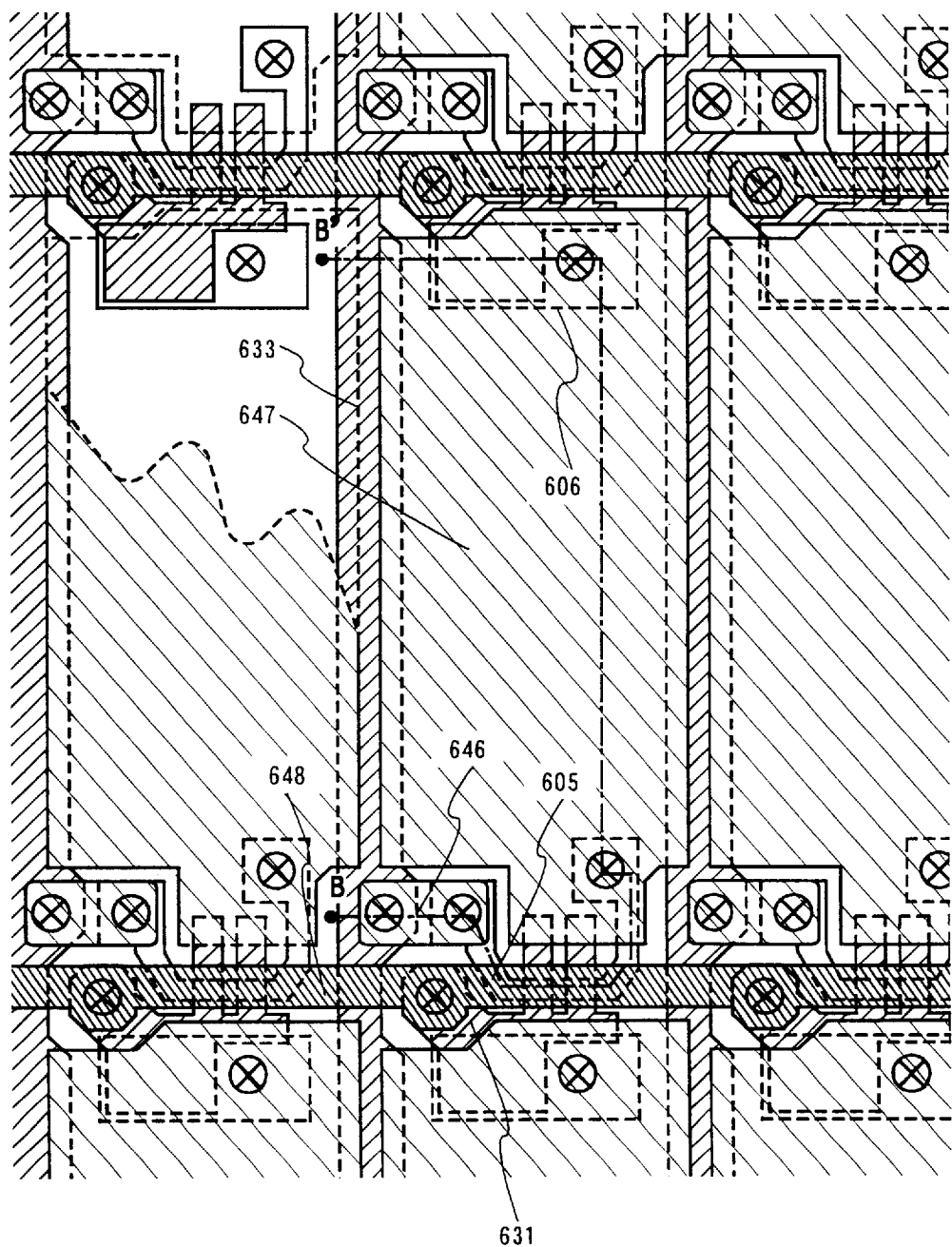
FIG. 13 is a top view illustrating the structure of a pixel portion.

In this way, the TFTs constituting a driving circuit 650 and a pixel portion 651 are formed on the same substrate. The driving circuit 650 shown in FIG. 12B has a p-channel TFT 652 and an n-channel TFT 653, which can constitute various kinds of functional circuits such as a shift register, a level shifter, a latch, and a buffer circuit. The B–B' sectional view in FIG. 12B corresponds to a view taken along the line B–B' in FIG. 13 that shows the pixel structure.

The p-channel TFT 652 of the driving circuit 650 has a channel formation region 660 and the first p type semiconductor region 661 that functions as a source or drain region. The n-channel TFT 653 of the driving circuit has a channel formation region 662, a first n type semiconductor region 663 that overlaps the gate electrode 621, and a second n type semiconductor region 664 that functions as a source or drain region.

An n-channel TFT 654 of the pixel portion 651 has a channel formation region 665, a first n type semiconductor region 666 that is formed outside a gate electrode 640, and second n type semiconductor regions 667 to 669 that function as source or drain regions. An auxiliary capacitor 655 is composed of the semiconductor film 606, the second insulating film 607, and the gate electrode 632. A first p type semiconductor region 671 is formed in the semiconductor film 606 through the above steps.

The first n type semiconductor regions formed in the n-channel TFTs are LDD (lightly doped drain) regions. When overlapping gate electrodes, as in the n-channel TFT 653, the LDD regions can ease the high electric field region generated in an end of the drain and prevent degradation due to the hot carrier effect. On the other hand, an LDD region that is placed outside a gate electrode as in the n-channel TFT 654 can reduce OFF current.

The p-channel TFT 652 has a single drain structure. Instead, it may take a structure in which an offset region is formed between the channel formation region and the impurity region by adjusting the third etching treatment time so as to move an end of the gate electrode and make space for the offset region. This structure can also be employed by the n-channel TFT 654, and is very effective in reducing OFF current.

An element substrate in which a pixel portion and a driving circuit are formed on the same substrate from TFTs is obtained in this way. According to the element substrate manufacturing process of this embodiment, TFTs having different LDD region structures can be formed on the same substrate with five photo masks.

In this manufacture process for TFTs, the heat treatment apparatus of the present invention can be used to conduct activation, as in Embodiment 3. Activation by the heat treatment method of the present invention takes only a short period of time and does not damage a substrate.

Embodiment 5

Figure 8A:
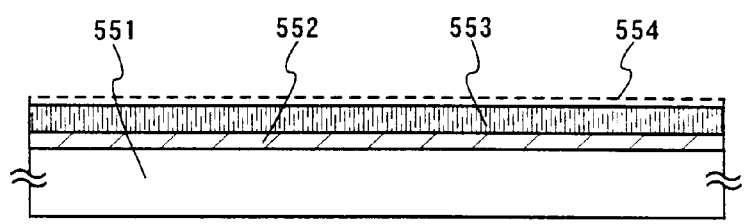
FIGS. 8A to 8C are sectional views illustrating a method of forming a semiconductor film.
Figure 8B:
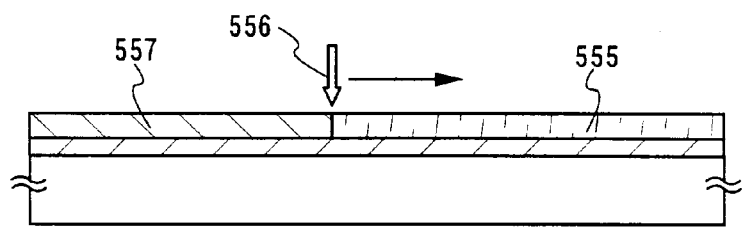
Figure 8C:
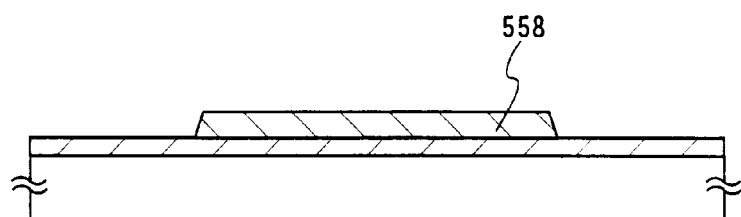

This embodiment gives a description with reference to FIGS. 8A to 8C on an example of a semiconductor film forming method that can be applied to Embodiment 3 or Embodiment 4. The semiconductor film forming method illustrated in FIGS. 8A to 8C includes doping the entire surface of an amorphous silicon film with a metal element before crystallization. The metal element used is one selected from the group consisting of Fe, Co, Ni, Ru, Rh, Pd, Os, Ir, Pt, Cu, and Au, or a combination thereof. Typically, Ni is employed. It has been found that these elements are capable of lowering the heat treatment temperature for crystallization and shortening the heat treatment time.

In FIG. 8A, a glass substrate typical example of which is the Corning #1737 glass substrate (product of Corning Incorporated) is first prepared as a substrate 551. On a surface of the substrate 551, a silicon oxynitride film is formed by plasma CVD from $SiH_4$ and $N_2O$ to have a thickness of 100 nm as a first insulating film 552. The first insulating film is provided in order to prevent an alkaline metal contained in the glass substrate from diffusing into a semiconductor film to be formed on the first insulating film.

An amorphous silicon film 553 is formed by plasma CVD. $SiH_4$ is introduced to a reaction chamber and then decomposed by intermittent electric discharge or pulse electric discharge to be deposited on the substrate 551. For example, the film formation conditions include modulating a high frequency power of 27 MHz and setting the repetition frequency to 5 kHz and the duty ratio to 20% for intermittent electric discharge to deposit $SiH_4$ to have a thickness of 54 nm. Of course, continuous electric discharge using 13.56 MHz power may be used instead. In order to reduce impurities such as oxygen, nitrogen, and carbon in the amorphous silicon film 553, $SiH_4$ used has to have a purity of 99.9999% or higher. The plasma CVD apparatus used has a reaction chamber which is 13 liter in volume and has a compound molecular pump capable of exhausting 300 liters per second at a first stage and a dry pump capable of exhausting 40 $m^3$ per hour at a second stage. This structure prevents reverse diffusion of organic vapors from the exhaust system side and raise the attained vacuum in the reaction chamber, whereby a minimum amount of impurity elements are allowed to mix in the amorphous semiconductor film during its formation.

Then, a nickel acetate solution containing 10 ppm of nickel by weight is applied using a spinner to form a nickel containing layer 554. To make the solution permeate well, the amorphous silicon film 553 is subjected to surface treatment. The surface treatment includes forming a very thin oxide film from an ozone containing aqueous solution, etching the oxide film with a mixture solution of fluorine acid and hydrogen peroxide to form a clean surface, and then treating the surface with the ozone containing aqueous solution to form a very thin oxide film again. Since a silicon surface is hydrophobic in nature, the oxide film thus formed helps the nickel acetate solution to be applied uniformly.

Next, hydrogen is released from the amorphous silicon film through one hour heat treatment at 500° C. Another heat treatment is then conducted at 580° C. for four hours to crystallize the amorphous silicon film. Thus formed is a crystalline silicon film 555 shown in FIG. 8B.

In order to raise the crystallization ratio (the ratio of crystal components to the total volume of the film) and repair defects remaining in crystal grains, the crystalline silicon film 555 is irradiated with laser light 556 through laser annealing. The laser light used is excimer laser light having a wavelength of 308 nm and oscillating at 30 Hz. The laser light is collected by an optical system into a beam of 100 to 300 $mJ/cm^2$, and the laser treatment is given with the overlapping ratio set to 90 to 95% while avoiding melting of the semiconductor film. As a result, a crystalline silicon film 557 is obtained.

The crystalline silicon film 557 is divided into islands to form a semiconductor film 558. The semiconductor film thus obtained can be adopted by Embodiment 3 and Embodiment 4 without any modification.

Embodiment 6

Figure 9:
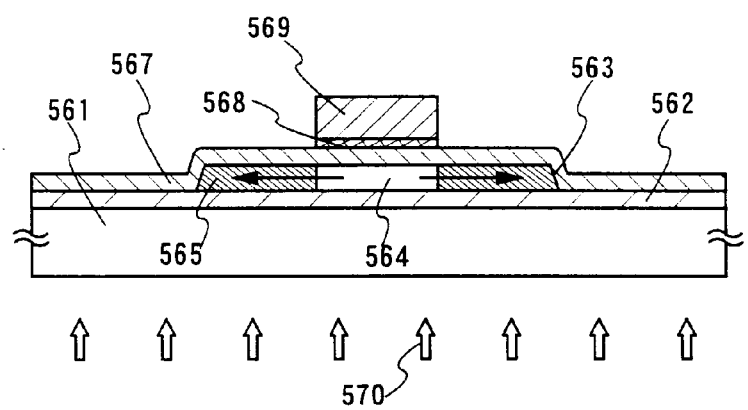
FIG. 9 is a diagram illustrating a gettering method.

This embodiment describes with reference to FIG. 9 an example of performing gettering on the semiconductor film obtained in Embodiment 5 to remove the metal element remaining in the film. The gettering method described here is for removing the metal element from a channel formation region of a TFT through gettering. In FIG. 9, a first insulating film 562, a semiconductor film 563, a second insulating film 567, a first conductive film 568, and a second conductive film 569 are layered on a substrate 561. The semiconductor film 563 is the one formed in accordance with the method of Embodiment 5, and has an n type semiconductor region 565 that contains phosphorus in a concentration of $1 \times 10^{20}$ to $1 \times 10^{21}$ atoms/cm$^3$.

When the semiconductor film 563 is used to form a TFT, the n type semiconductor region 565 serves as a source or drain region of the TFT whereas a region 564 serves as a channel formation region of the TFT. In the channel formation region, the metal element used in the doping for crystallization remains in a concentration of $1 \times 10^{17}$ to $1 \times 10^{19}$ atoms/cm$^3$. The heat treatment method of the present invention makes the remaining metal element to segregate in the n type semiconductor region 565, thus achieving gettering.

This heat treatment method follows the description of Embodiment 1 and the semiconductor film is irradiated with pulsative radiation 570 from the substrate side. The pulsative radiation shown as a curve A in the graph of FIG. 3 is suitable. With the pulsative radiation represented by the curve A, the semiconductor film is heated at a rate of 100 to 200° C. per second until it reaches 1100° C., kept at 1100° C. for four seconds, and then cooled down to 300 to 400° C. at a rate of 50 to 150° C. per second. One such radiation is enough to obtain the gettering effect. However, it is more desirable to repeat the pulsative radiation 2 to 10 times. In this way, the concentration of the metal element used in the crystallization step can be reduced to less than $1 \times 10^{17}$ atoms/cm$^3$.

This gettering method can be combined with Embodiment 3 or 4. For instance, the gettering described in this embodiment can be combined with the heat treatment for activation in Embodiment 4.

Embodiment 7

Figure 14:
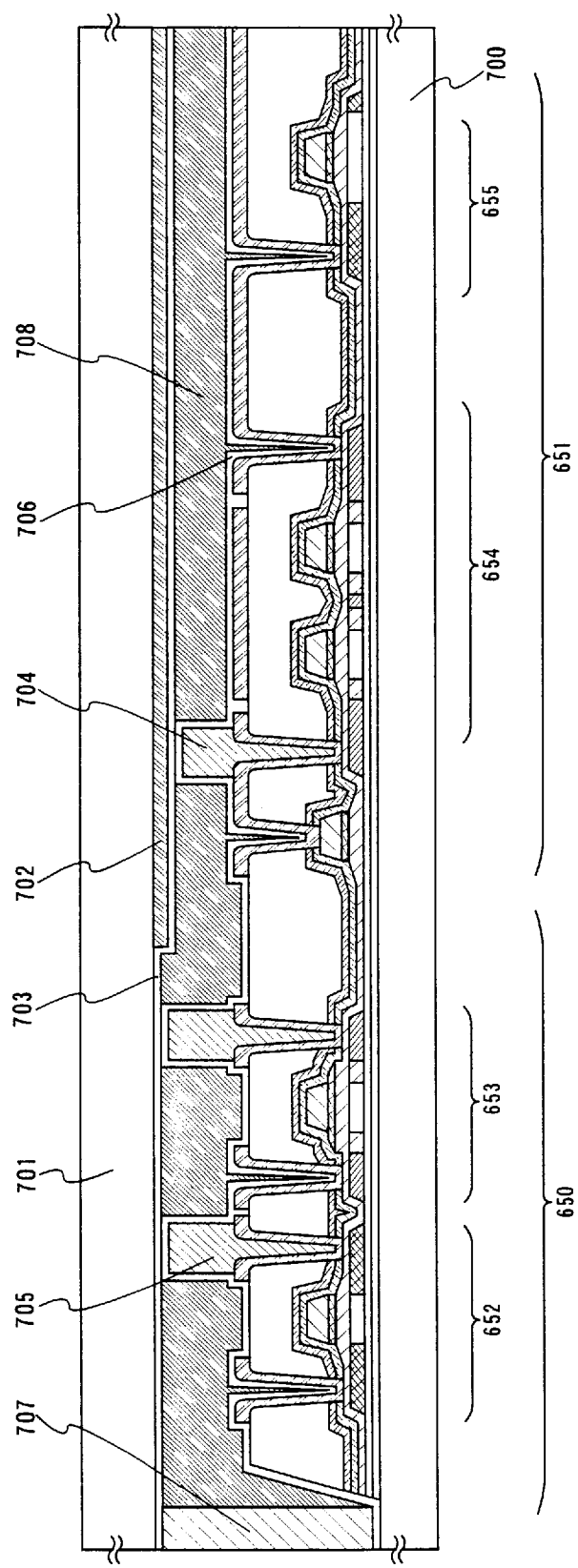
FIG. 14 is a diagram illustrating the structure of a liquid crystal display device obtained by the present invention.

This embodiment describes a process of manufacturing an active matrix-driven liquid crystal display device from a substrate on which a driving circuit and a pixel portion are formed and which is obtained in accordance with Embodiment 4 (the substrate is called an element substrate). FIG. 14 shows an element substrate 700 bonded to an opposite substrate 701 with a sealing member. Columnar spacers 704 and 705 are formed on the element substrate 700. It is appropriate to position the columnar spacer 704 at the indention of a contact portion formed on a pixel electrode. The height of the columnar spacer 704 is set to 3 to 10 μm, though it varies depending on the liquid crystal material used. The contact portion has a concave portion corresponding to a contact hole, and disturbance in liquid crystal orientation can be avoided by positioning the spacer at the concave portion. Thereafter an oriented film 706 is formed and subjected to rubbing treatment. A transparent conductive film 702 and an oriented film 703 are formed on one surface of the opposite substrate 701. The element substrate 700 is then bonded to the opposite substrate 701 with a seal 707 and a liquid crystal is injected to form a liquid crystal layer 708. Thus the active matrix-driven liquid crystal display device is completed.

Embodiment 8

Figure 15:
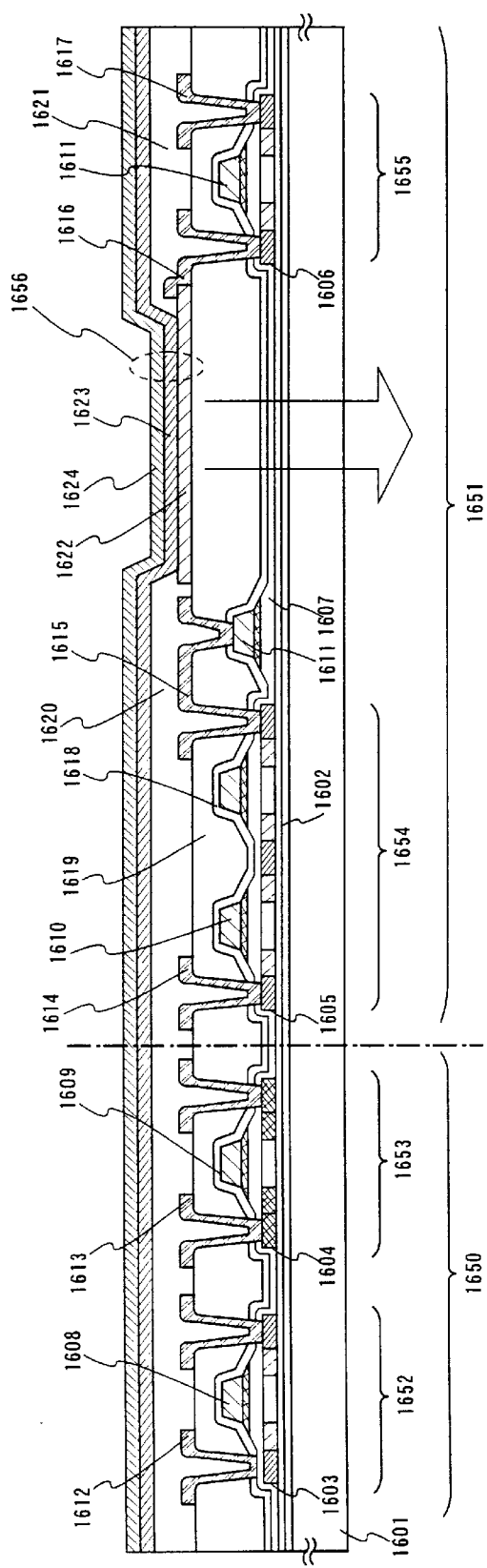
FIG. 15 is a diagram illustrating the structure of a light emitting device obtained by the present invention.

This embodiment describes with reference to FIG. 15 a process manufacturing an active matrix-driven light emitting device from TFTs obtained in accordance with Embodiment 4.

A glass substrate is used for a substrate 1601. On the glass substrate 1601, an n-channel TFT 1652 and a p-channel TFT 1653 are formed in a driving circuit portion 1650 whereas a switching TFT 1654 and a current controlling TFT 1655 are formed in a pixel portion 1651. These TFTs are composed of semiconductor layers 1603 to 1606, a second gate insulating film 1607 that serves as a gate insulating film, gate electrodes 1608 to 1611, and others.

A first insulating film 1602 formed on the substrate 1601 is a silicon oxynitride (expressed as SiO$_x$N$_y$) film or a silicon nitride film with a thickness of 50 to 200 nm. An interlayer insulating film consists of an inorganic insulating film 1618 such as a silicon nitride film or a silicon oxynitride film and an organic insulating film 1619 such as an acrylic film or a polyimide film.

In the driving circuit portion 1650, a gate signal line side driving circuit and a data signal line side driving circuit are different in circuit structure but explanations thereof are omitted here. Wiring lines 1612 and 1613 are connected to the n-channel TFT 1652 and the p-channel TFT 1653, respectively. The TFTs are used to construct circuits such as a shift register, a latch circuit, and a buffer circuit.

In the pixel portion 1651, a data wiring line 1614 is connected to the source side of the switching TFT 1654 whereas a wiring line 1615 is connected to the drain side thereof. The wiring line 1615 is connected to the gate electrode 1611 of the current controlling TFT 1655. The source side of the current controlling TFT 1655 is connected to a power supply wiring line 1617, and a drain side electrode 1616 of the TFT 1655 is connected to an anode of an EL element.

The EL element has the anode, a cathode, and a layer containing an organic compound that provides electroluminescence (hereinafter referred to as EL layer), with the EL layer interposed between the anode and the cathode. The EL element is formed on the TFTs of the pixel portion. Luminescence provided by organic compounds are divided into light emission upon returning from singlet excitation to the base state (fluorescence) and light emission upon returning from triplet excitation to the base state (phosphorescence). Luminescence in the present invention includes both.

The EL element is formed after banks 1620 and 1621 are formed from an organic resin such as acrylic and polyimide, preferably, a photo-sensitive organic resin, so as to cover the wiring lines. In this embodiment, an EL element 1656 is composed of an anode 1622 formed of ITO (indium tin oxide), an EL layer 1623, and a cathode 1624 formed of an alkaline metal or an alkaline earth metal such as MgAg and LiF. The banks 1620 and 1621 cover ends of the anode 1622 to prevent short circuit between the cathode and the anode.

The cathode 1624 of the EL element is placed on the EL layer 1623. The material of the cathode 1624 contains an element having a small work function, such as magnesium (Mg), lithium (Li), or calcium (Ca). Preferably, an electrode formed of MgAg (obtained by mixing Mg and Ag with a ratio of Mg to Ag set to 10:1) is used for the cathode. Other examples of the cathode include a MgAgAl electrode, a LiAl electrode, and a LiFAl electrode.

During the laminate of the EL layer 1623 and the cathode 1624 for one pixel is formed, the laminate for another pixel cannot be formed. However, photolithography that is the usual solution for such case is not an option here because the EL layer 1623 is extremely weak against moisture. In addition, the cathode 1624 formed of an alkaline metal is easily oxidized. Accordingly, the EL layer and the cathode are selectively formed by a vapor phase method such as vacuum evaporation, sputtering, or plasma CVD using a metal mask or other physical mask. A protective electrode may be laid on the cathode 1624 in order to protect the EL layer from moisture on the outside. The protective electrode is preferably formed of a low resistant material containing aluminum (Al), copper (Cu), or silver (Ag).

In order to obtain high luminance with small power consumption, an organic compound that emits light by a triplet exciton (the compound is hereinafter referred to as triplet compound) is used for the material of the EL layer. A singlet compound refers to a compound that emits light through singlet excitation alone whereas a triplet compound refers to a compound that emits light through triplet excitation.

Materials given as typical triplet compounds are organic compounds described in the following articles: (1) T. Tsutsui, C. Adachi, S. Saito, Photochemical Processes in Organized Molecular Systems, ed. K. Honda, (Elsevier Sci. Pub., Tokyo, 1991) P. 437. (2) M. A. Baldo, D. F. O'Brien, Y. You, A. Shoustikov, S. Sibley, M. E. Thompson, S. R. Forrest, Nature 395 (1998) p.151. This paper discloses organic compounds given by the following equation. (3) M. A. Baldo, S. Lamansky, P. E. Burrows, M. E. Thompson. S. R. Forrest, Appl. Phys. Lett., 75 (1999) p.4. (4) T. Tsutsui, M. J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

The triplet compounds above have higher light emission efficiency than singlet compounds and require lower operation voltage (voltage necessary to cause an EL element to emit light) to emit light of the same luminance.

In FIG. 15, the switching TFT 1654 has a multi-gate structure and the current controlling TFT 1655 has an LDD region that overlaps the gate electrode. A TFT formed of polycrystalline silicon has high operation speed and therefore is liable to deteriorate upon hot carrier injection. For that reason, to form TFTs structured differently to suit their respective functions (the switching TFT having satisfactorily low OFF current and the current controlling TFT resistant to hot carrier injection) in one pixel, as shown in FIG. 15, is very effective in manufacturing a display device that is highly reliable and capable of excellent image display (has high operation performance). The active matrix-driven light emitting device is thus completed.

Embodiment 9

A crystalline semiconductor film is doped with phosphorus, which is then activated by the heat treatment method of the present invention. Three samples of this are prepared and their micrographs are respectively shown in FIGS. 17A to 17C. Each sample has a structure similar to the one shown in FIG. 4, and has a glass substrate on which a silicon oxynitride film with a thickness of 100 nm, a semiconductor film with a thickness of 50 nm, and a silicon oxynitride film with a thickness of 80 nm are layered. A 30 nm thick tantalum nitride film and a 300 nm thick tungsten film that are formed by patterning are further placed thereon.

As well known, a region doped with an impurity element by ion doping is turned amorphous at the impact of the ions. After that heat treatment is necessary in order to recrystallize the amorphous region and activate the impurity element at the same time.

Figure 17A:
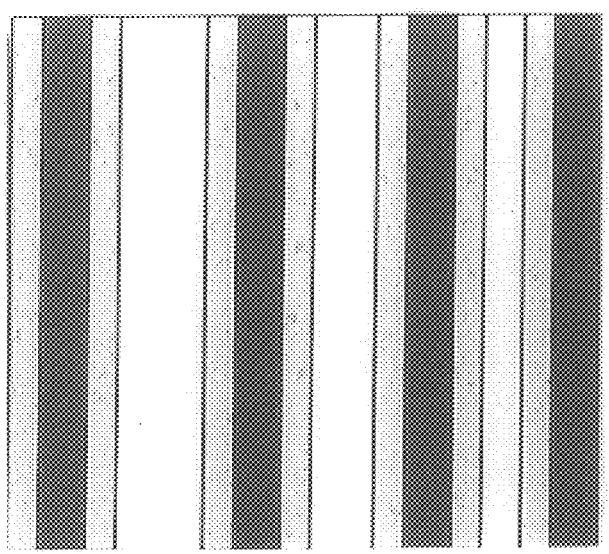
FIGS. 17A to 17C are micrographs of semiconductor films after receiving activation treatment in accordance with a heat treatment method of the present invention.
Figure 17B:
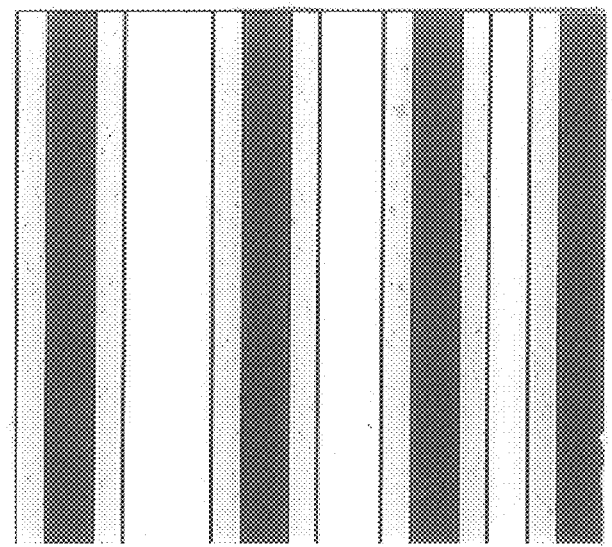
Figure 17C:
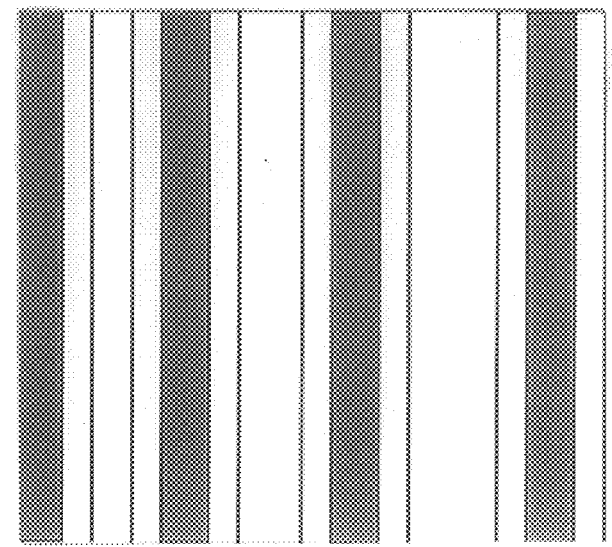

The samples are irradiated with the radiation equivalent to the pulsative radiation represented by the curve A (holding time: 4 seconds) in the graph of FIG. 3 or the pulsative radiation represented by the curve B (holding time: 0.75 second). FIG. 17A is the picture of the sample that is irradiated once with the pulsative radiation of the curve B. Spots are observed in a region where the semiconductor film is exposed, indicating that the film is not crystallized much. Upon inspecting the photos, a dark part is judged as an amorphous portion whereas a light part is judged as a crystalline portion based on rule of thumb. FIG. 17B is the picture of the sample that is irradiated four times with the pulsative radiation of the curve B. Spots are observed here as in FIG. 17A but they are smaller in number. FIG. 17C is the picture of the sample that is irradiated once with the pulsative radiation of the curve A. Most part of the semi-conductor film in FIG. 17C is crystalline.

The above results show that the heat treatment method of the present invention is capable of activating phosphorus injected by ion doping without damaging the substrate, and that several times irradiation produces better outcome, though depending on irradiation conditions.

Embodiment 10

The various kinds of semiconductor devices can be formed by using the present invention. The semiconductor devices, which can be applied to the present invention, include portable information terminals (electronic notebook, mobile computer, cell phone, etc.), video camera, still camera, personal computer, TV and projector. Their examples are shown in FIGS. 18A to 18E, 19A to 19C and 20A to 20D.

Figure 18A:
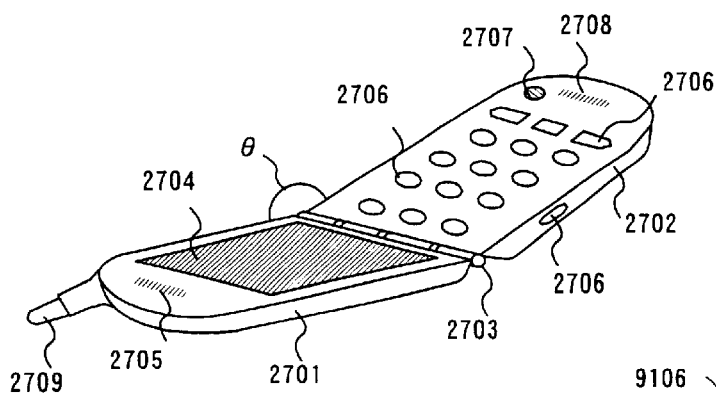
FIGS. 18A to 18E are diagrams showing examples of a semiconductor device.

FIG. 18A shows a cellular phone which comprises a display panel 2701, an operation panel 2702 and a connection portion 2703, the display panel 2701 including a display device 2704 typified by a liquid crystal display device or an EL display device, a voice output unit 2705 and an antenna 2709. The operation panel 2702 includes operation keys 2706, a power source switch 2707, a voice input unit 2708, and so on. This invention forms the display device 2704 and the cell phone can be accomplished.

Figure 18C:
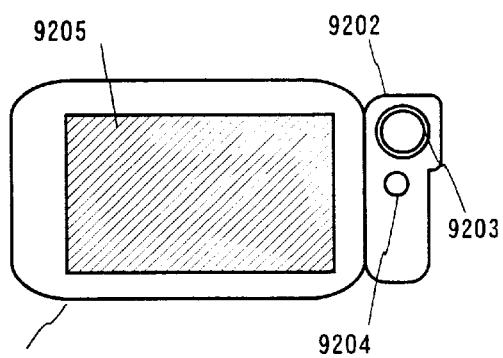
Figure 18B:
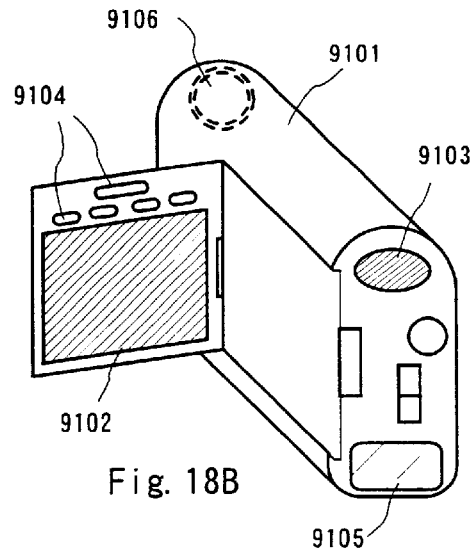

FIG. 18B shows a video camera which comprises a main body 9101, a display device 9102 typified by a liquid crystal display device or an EL display device, a voice input unit 9103, operation switches 9104, a battery 9105 and an image receiving unit 9106. The invention can be applied to the display device 9102 and the video camera can be accomplished.

FIG. 18C shows a mobile computer or a portable information terminal which is constituted by a main body 9201, a camera unit 9202, a picture unit 9203, operation switches 9204 and a display device 9205 typified by a liquid crystal display device or an EL display device. The semiconductor device of this invention can be applied to the display device 9205 and the portable information terminal can be accomplished.

Figure 18D:
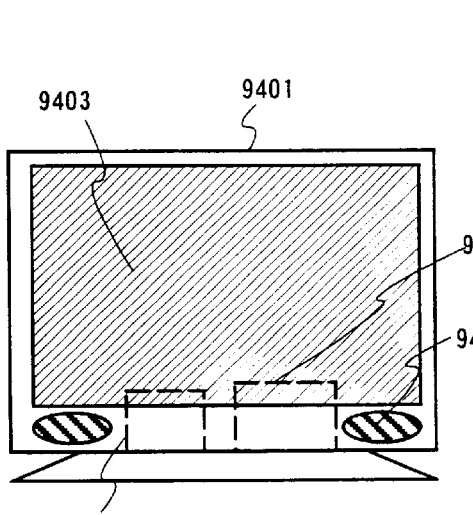

FIG. 18D shows a TV receiver constituted by a main body 9401, a speaker 9402, a display device 9403 typified by a liquid crystal display device or an EL display device, a receiver unit 9404 and an amplifier unit 9405. The invention can be applied to the display device 9403 and the TV can be accomplished.

Figure 18E:
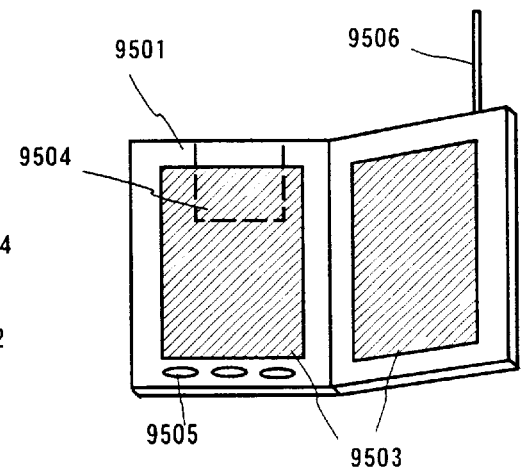

FIG. 18E shows a portable notebook constituted by a main body 9501, display device 9503 typified by a liquid crystal display device or an EL display device, a storage medium 9504, operation switches 9505 and an antenna 9506, which is used for displaying data stored in a mini-disk (MD) or in a DVD and for displaying data received by the antenna. The invention can be applied to the display device 9503 and the portable notebook can be accomplished.

Figure 19A:
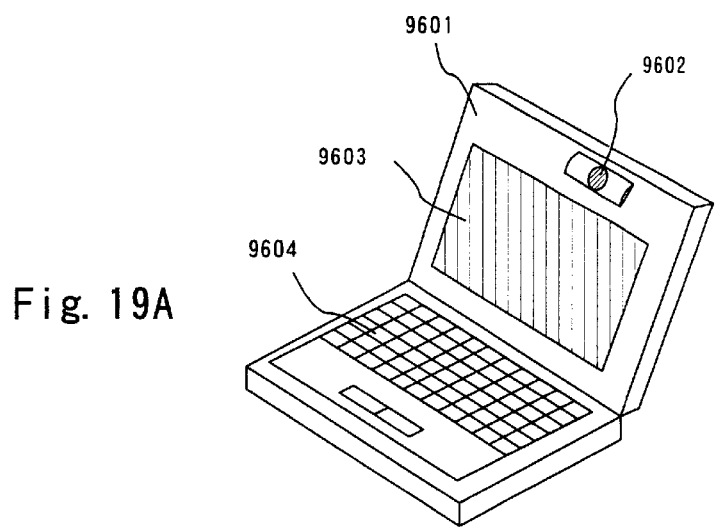
FIGS. 19A to 19C are diagrams showing examples of a semiconductor device.

FIG. 19A shows a personal computer constituted by a main body 9601, an image input unit 9602, a display device 9603 typified by a liquid crystal display device or an EL display device and a keyboard 9604. The invention can be applied to the display device 9603 and the personal computer can be accomplished.

Figure 19B:
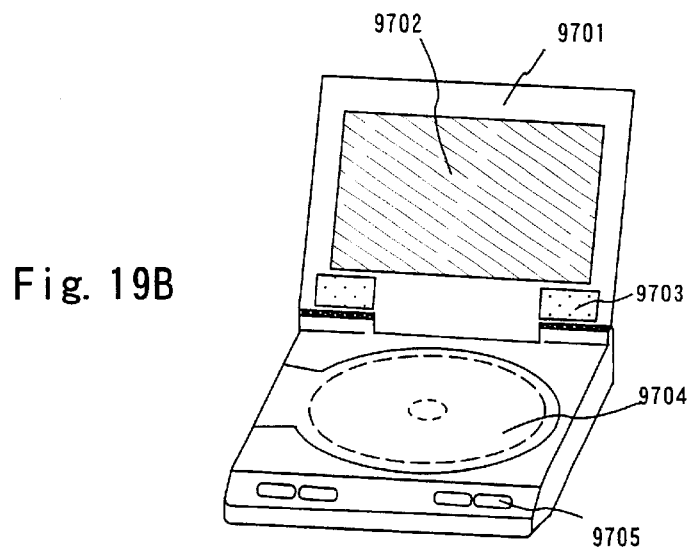

FIG. 19B shows a player using a recording medium recording a program (hereinafter referred to as recording medium), which is constituted by a main body 9701, a display device 9702 typified by a liquid crystal display device or an EL display device, a speaker unit 9703, a recording medium 9704 and operation switches 9705. This device uses a DVD (digital versatile disc) or a CD as a recording medium, with which the user can enjoy appreciating music, movies, or playing games or Internet. The invention can be applied to the display device 9702 and the player can be accomplished.

Figure 19C:
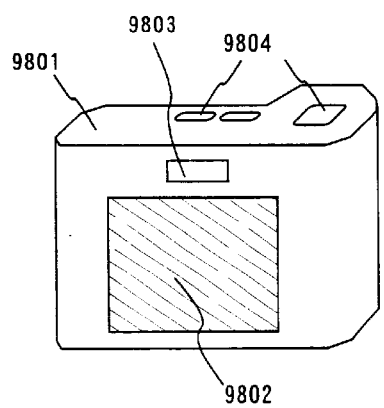

FIG. 19C shows a digital camera constituted by a main body 9801, a display device 9802 typified by a liquid crystal display device or an EL display device, an eyepiece unit 9803, operation switches 9804 and an image receiving unit (not shown). The invention can be applied to the display device 9802 and the digital camera can be accomplished.

Figure 20A:
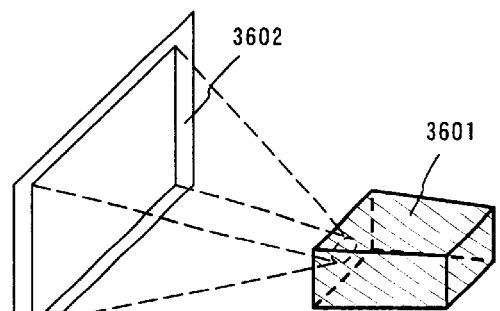
FIGS. 20A to 20D are diagrams illustrating the structure of projectors.

FIG. 20A shows a front-type projector constituted by a projector 3601 and a screen 3602. The invention can be applied to the projector 3601 and the front-type projector can be accomplished.

Figure 20B:
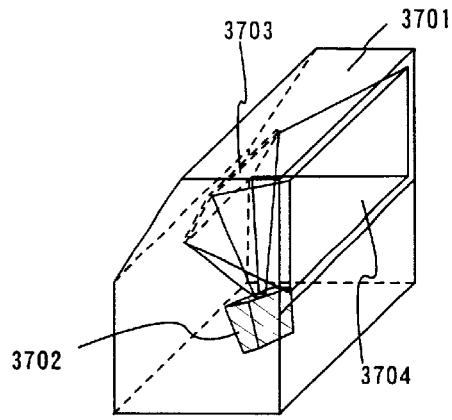

FIG. 20B shows a rear-type projector constituted by a main body 3701, a projector 3702, a mirror 3703 and a screen 3704. The invention can be applied to the liquid crystal display device integrated to the projector 3702 and the rear-type projector can be accomplished.

Figure 20C:
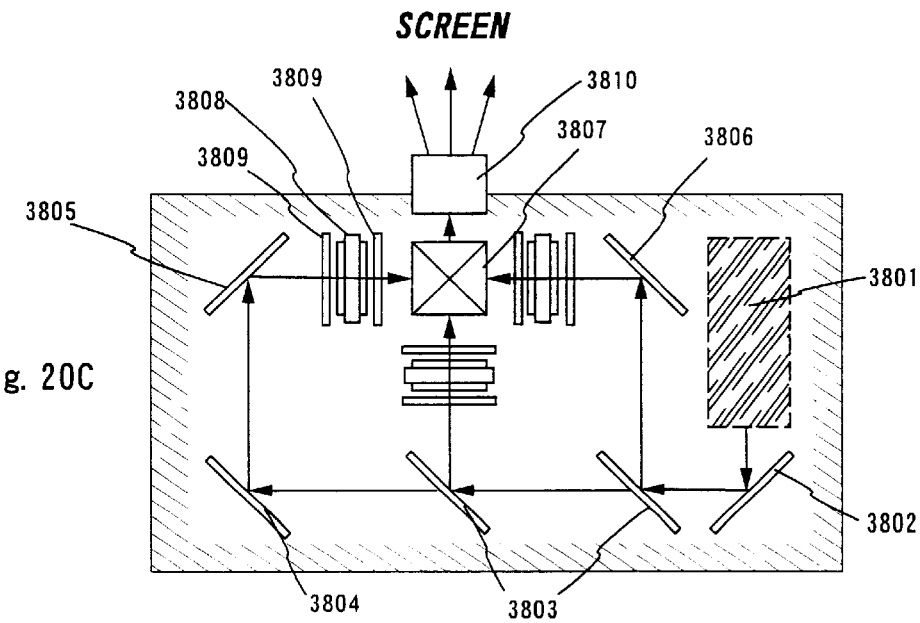

FIG. 20C is a diagram illustrating an example of structures of the projectors 3601 and 3702 in FIGS. 20A and 20B. The projectors 3601, 3702 are constituted by an optical system 3801 of a source of light, mirrors 3802, 3804 to 3806, a dichroic mirror 3803, a prism 3807, a liquid crystal display device 3808, a phase difference plate 3809 and a projection optical system 3810. The projection optical system 3810 is constituted by an optical system inclusive of a projection lens. Though this embodiment shows an example of the three-plate type, there may be employed the one of the single-plate type without being limited thereto. In the optical paths indicated by arrows in FIG. 20C, further, the user may suitably provide an optical system such as an optical lens, a film having a polarizing function, a film for adjusting the phase difference or an IR film.

Figure 20D:
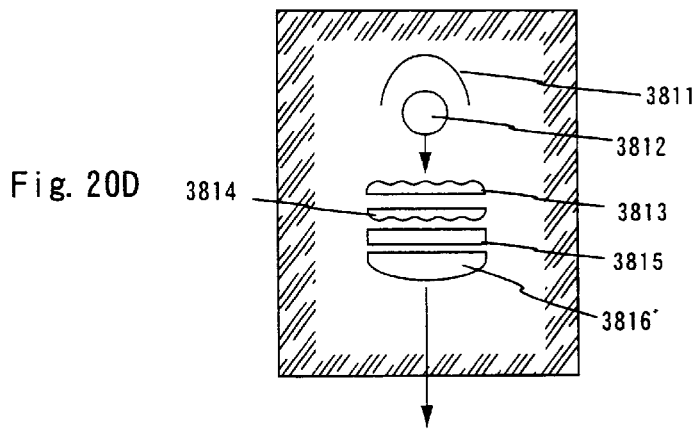

FIG. 20D is a diagram illustrating an example of the structure of the optical system 3801 of the source of light in FIG. 20C. In this embodiment, the optical system 3801 of the source of light is constituted by a reflector 3811, a source of light 3812, lens arrays 3813, 3814, a polarizer/converter element 3815 and a focusing lens 3816. The optical system of the source of light shown in FIG. 20D is only an example, and is not particularly limited thereto only. For example, the user may suitably provide the optical system of the source of light with an optical system such as an optical lens, a film having a polarizing function, a film for adjusting the phase difference or an IR film.

Though not diagramed, the invention can be further applied as a display device to navigation systems as well as to refrigerators, washing machines, microwave ovens, fixed telephones and display device integrated facsimile. Thus, the invention has a very wide range of applications and can be applied to a variety of products.

Embodiment 11

Figure 21A:
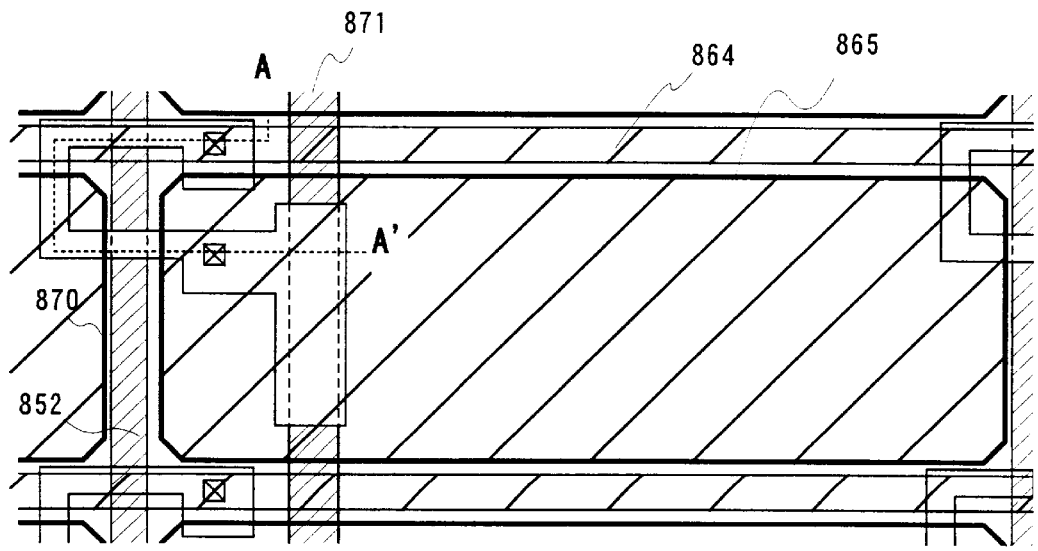
FIGS. 21A and 21B are a top view of a pixel portion and a sectional view thereof, respectively.
Figure 21B:
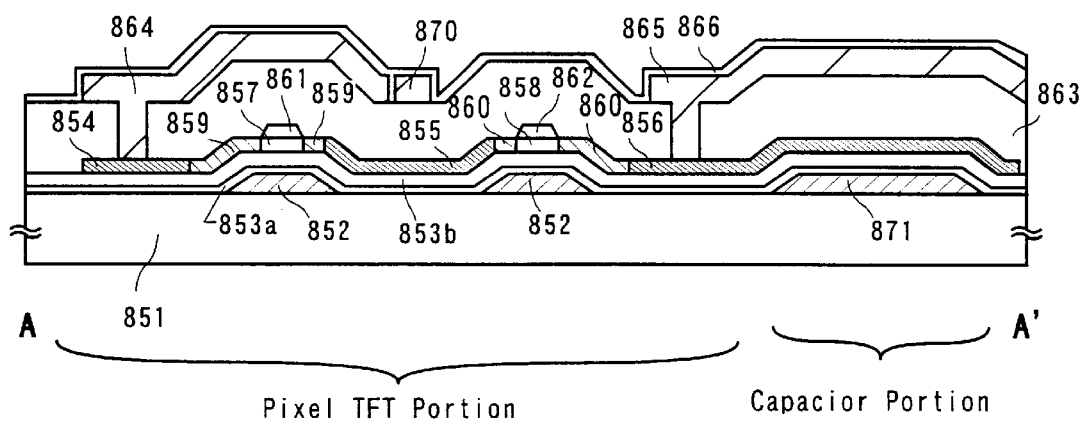

Described in this embodiment with reference to FIGS. 21A and 21B is an example of using a reverse stagger TFT to constitute a pixel portion of a liquid crystal display device. FIG. 21A is an enlarged top view of one of pixels in the pixel portion formed on an element substrate. FIG. 21B is a sectional view of the pixel portion taken along the dotted line A–A' of FIG. 21A.

In FIG. 21B, reference symbol 851 denotes a substrate on which a base insulating film (not shown) is formed first.

In the pixel portion, a pixel TFT is an n-channel TFT. A gate electrode 852 is formed on the base insulating film that has been formed on the substrate 851. Formed on the gate electrode 852 are a first insulating film 853a that is a silicon nitride film and a second insulating film 853b that is a silicon oxide film. Second n type impurity regions 854 to 856, channel formation regions 857 and 858, and first n type impurity regions 859 and 860 are formed as an active layer on the second insulating film. The second impurity regions 854 to 856 serve as source regions or drain regions. The first n type impurity region 859 is placed between the second n type impurity region 854 and the channel formation region 857. The first n type impurity region 860 is placed between the second n type impurity region 855 and the channel formation region 858. The channel formation regions 857 and 858 are protected by insulating layers 861 and 862, respectively. A first interlayer insulating film 863 covers the insulating layers 861 and 862 and the active layer. After contact holes are formed in the first interlayer insulating film 863, a wiring line 864 connected to the second n type impurity region 854 is formed and a pixel electrode 865 formed of Al or Ag is connected to the second n type impurity region 856. A passivation film 866 is formed thereon. Denoted by 870 is a pixel electrode adjacent to the pixel electrode 865.

In this embodiment, gate wiring is made in such a way that the pixel TFT of the pixel portion has a double gate structure. However, the pixel TFT may take a triple gate or other multi-gate structure to reduce fluctuation in OFF current. It can also take a single gate structure to improve the aperture ratio.

A capacitor in the pixel portion is composed of a capacitance wiring line 871 and the second n type impurity region 856, with the first insulating film and the second insulating film as dielectric.

Needless to say, the pixel portion shown in FIGS. 21A and 21B is merely an example and it is not limited to the above structure.

The heat treatment apparatus of the present invention can be used to carry out heat treatment in manufacturing the pixel portion TFT shown in FIG. 21B. For example, the apparatus can be used for activation and gettering of an impurity element contained in the second n type impurity regions. The apparatus is the one described in Embodiment 1 or 2, and irradiates the regions several times through pulsative radiation. The regions may be irradiated with the pulsative radiation from the substrate side or the opposite side thereof.

A liquid crystal display device is obtained from the element substrate of this embodiment when following the description in Embodiment 7. The liquid crystal display device thus manufactured can be used as a display unit of various electronic equipments shown in Embodiment 10.

Embodiment 12

This embodiment gives descriptions on characteristics of a TFT formed from a semiconductor film on which gettering treatment shown in Embodiment 6 is performed. The TFT has the single drain structure and the channel length thereof is 10 μm whereas the channel width is 8 μm. The catalytic element reducing effect of gettering is evaluated with the OFF current value as a substitute characteristic. If the OFF current value is 1 pA or lower, the effect of gettering is considered satisfiable.

In the gettering, the highest temperature is set to 690 to 730° C. and the holding time is set to 300 seconds. Irradiation is repeated three times under these conditions.

Figure 22:
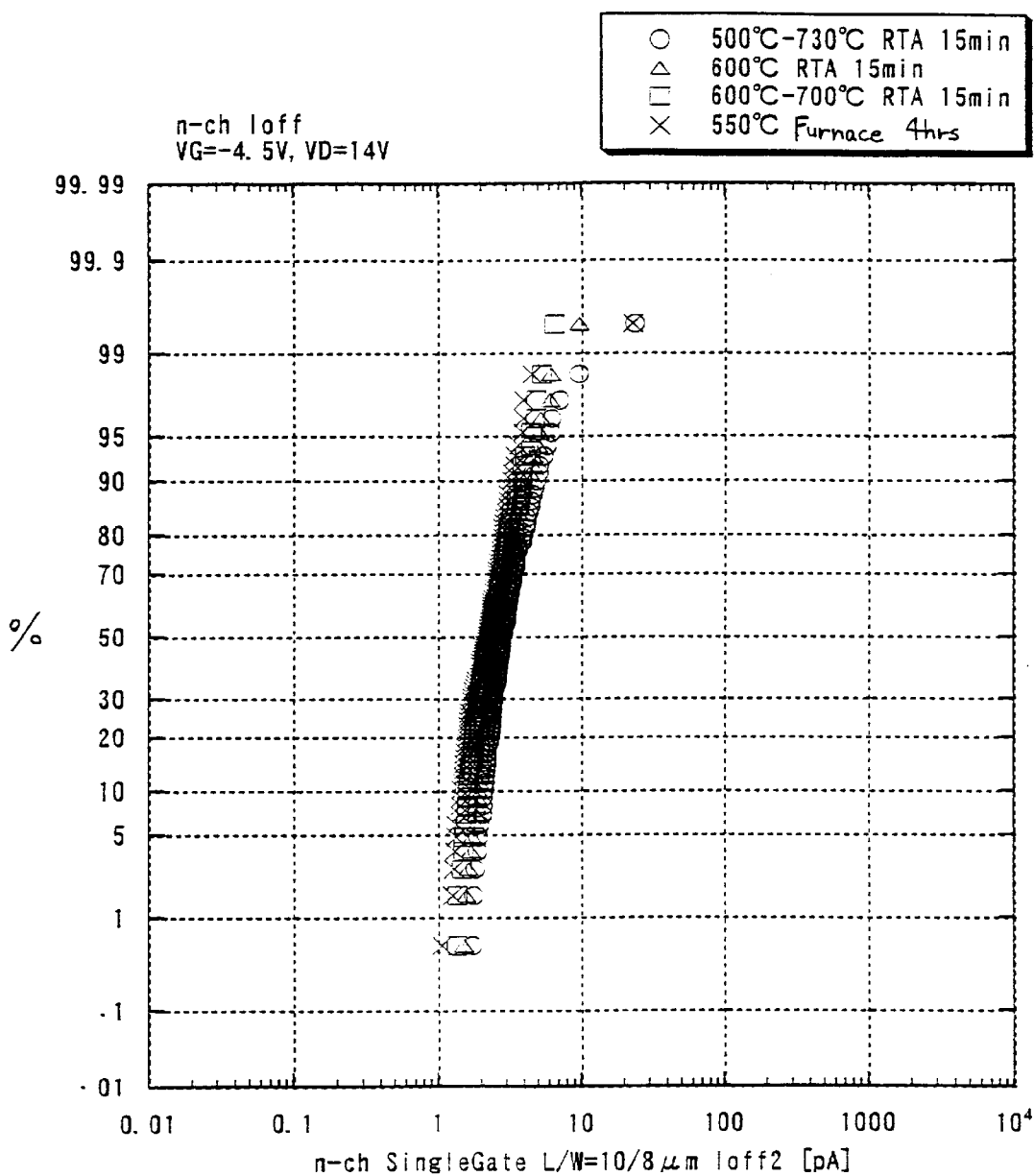
FIG. 22 is an ogive graph showing the distribution of OFF current of TFTs in plural samples.

FIG. 22 is an ogive graph showing the OFF current value distribution (fluctuation) for 94 samples. The graph also shows, for comparison, data of samples subjected to gettering treatment at 550° C. for four hours in a furnace annealing. According to the graph, there is no significant difference between the two groups. The graph shows that the heat treatment method of the present invention provides excellent gettering in a shorter time than the conventional gettering using a furnace annealing takes.

The heat treatment method of the present invention makes it possible to conduct activation and gettering of an impurity element used to dope a semiconductor film in a short period of time without damaging a substrate. The heat treatment apparatus of the present invention makes such heat treatment possible. The productivity in manufacturing a semiconductor device can be improved by employing this heat treatment method.

What is claimed is:

1. A semiconductor device manufacturing method comprising the steps of:
    forming a semiconductor film over a substrate;
    forming an insulating film over said semiconductor film;
    forming a conductive film over said insulating film;
    doping said semiconductor film with an impurity of one conductivity type to form a semiconductor region of one conductivity type; and
    activating said semiconductor region of said one conductivity type by irradiating said semiconductor region several times from said substrate side through intermittent radiation from a lamp light source,
    wherein the intermittent radiation from said lamp light source lasts 0.1 to 20 seconds at a time.

2. A semiconductor device manufacturing method comprising the steps of:
    forming a semiconductor film over a substrate;
    forming an insulating film over said semiconductor film;
    forming a light absorptive first conductive film on said insulating film;
    forming a light reflective second conductive film on said first conductive film;
    doping said semiconductor film with an impurity of one conductivity type to form a semiconductor region of one conductivity type; and
    activating said semiconductor region of said one conductivity type by irradiating said semiconductor region several times from said substrate side through intermittent radiation from a lamp light source.

3. A semiconductor device manufacturing method comprising the steps of:
    forming an amorphous semiconductor film over one major surface of a substrate;
    introducing said amorphous semiconductor film with a metal element;
    crystallizing said amorphous semiconductor film to form a crystalline semiconductor film;
    forming a conductive film over said crystalline semiconductor film so as to partially overlap said crystalline semiconductor film;
    forming a semiconductor region of one conductivity type in said crystalline semiconductor film; and
    irradiating the one major surface of said substrate and the opposite surface thereof several times through intermittent radiation from a lamp light source,
    wherein the intermittent radiation from said lamp light source lasts 0.1 to 20 seconds at a time.

4. A semiconductor device manufacturing method comprising the steps of:
    forming an amorphous semiconductor film over one major surface of a substrate;
    introducing said amorphous semiconductor film with a metal element;
    crystallizing said amorphous semiconductor film to form a crystalline semiconductor film;
    forming a conductive film over said crystalline semiconductor film so as to partially overlap said crystalline semiconductor film;
    forming a semiconductor region doped with phosphorus in said crystalline semiconductor film; and
    irradiating the one major surface of said substrate and the opposite surface thereof several times through intermittent radiation from a lamp light source,
    wherein the intermittent radiation from said lamp light source lasts 0.1 to 20 seconds at a time.

5. A method according to any one of claims 1 to 4, wherein said semiconductor device is selected from the group consisting of a cellular phone, a video camera, a mobile computer a portable information terminal, a TV, a portable notebook a personal computer, a player, a digital camera, a front-type projector and a rear-type projector.

6. A method according to any one of claims 3 and 4, wherein said metal element is selected from the group consisting of Fe, Co, Ni, Ru, Rh, Pd, Os, Ir, Pt, Cu, and Au, or a combination thereof.

7. A method according to any one of claims 1–4, wherein said lamp light source is selected from the group consisting of a halogen lamp, a metal halide lamp, a xenon lamp, a high pressure mercury lamp, a high pressure sodium lamp and an excimer lamp.

8. A semiconductor device manufacturing method comprising the steps of:
    forming a semiconductor film over a substrate;
    forming an insulating film over said semiconductor film;
    forming a conductive film over the insulating film;
    doping said semiconductor film with an impurity of one conductivity type to form a semiconductor region of one conductivity type;

holding said substrate in a processing chamber filled with a coolant;

activating the semiconductor region of said one conductivity type by irradiating the region several times from said substrate side through intermittent radiation from a lamp light source, wherein the intermittent radiation from said lamp light source lasts 0.1 to 20 seconds at a time.

9. A semiconductor device manufacturing method comprising the steps of:

forming a semiconductor film over a substrate;

forming an insulating film over said semiconductor film;

forming a conductive film over the insulating film;

doping said semiconductor film with an impurity of one conductivity type to form a semiconductor region of one conductivity type;

holding said substrate in a processing chamber filled with a coolant; and activating the semiconductor region of said one conductivity type by irradiating the region several times from said substrate side through intermittent radiation from a lamp light source, wherein said lamp light source is turned on and the intermittent radiation from said lamp light source is held for 0.1 to 20 seconds at a time, while an amount of supply of the coolant is reduced, wherein said lamp light source is turned off while a treatment of increasing the amount of supply of the coolant as one cycle is repeated several times.

10. A method according to any one of claims 8 and 9, wherein said lamp light source is selected from the group consisting of a halogen lamp, a metal halide lamp, a xenon lamp, a high pressure mercury lamp, a high pressure sodium lamp and an excimer lamp.

11. A method according to any one of claims 8 and 9, wherein said semiconductor device is selected from the group consisting of a cellular phone, a video camera, a mobile computer, a portable information terminal, a TV, a portable notebook, a personal computer, a player, a digital camera, a front-type projector and a rear-type projector.

* * * * *